US010403662B2

(12) United States Patent
Toda

(10) Patent No.: US 10,403,662 B2
(45) Date of Patent: Sep. 3, 2019

(54) SOLID-STATE IMAGING ELEMENT AND ELECTRONIC APPARATUS

(71) Applicant: SONY SEMICONDUCTOR SOLUTIONS CORPORATION, Kanagawa (JP)

(72) Inventor: Atsushi Toda, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 51 days.

(21) Appl. No.: 15/549,231

(22) PCT Filed: Feb. 12, 2016

(86) PCT No.: PCT/JP2016/054145
§ 371 (c)(1),
(2) Date: Aug. 7, 2017

(87) PCT Pub. No.: WO2016/136502
PCT Pub. Date: Sep. 1, 2016

(65) Prior Publication Data
US 2018/0040653 A1 Feb. 8, 2018

(30) Foreign Application Priority Data

Feb. 26, 2015 (JP) ................ 2015-036248

(51) Int. Cl.
H01L 27/00 (2006.01)
H01L 27/146 (2006.01)
(Continued)

(52) U.S. Cl.
CPC ........ *H01L 27/14621* (2013.01); *B82Y 15/00* (2013.01); *H01L 27/146* (2013.01);
(Continued)

(58) Field of Classification Search
CPC ........... H01L 31/02327; H01L 31/0236; H01L 31/055; H01L 27/14647; H01L 27/1464
(Continued)

(56) References Cited

U.S. PATENT DOCUMENTS

2011/0155891 A1  6/2011  Yamamoto
2013/0082343 A1  4/2013  Fudaba et al.
(Continued)

FOREIGN PATENT DOCUMENTS

CN   102110703 A   6/2011
CN   103681728 A   3/2014
(Continued)

OTHER PUBLICATIONS

International Search Report and Written Opinion of PCT Application No. PCT/JP2016/054145, dated Mar. 15, 2016, 02 pages of English Translation and 07 pages of ISRWO.

*Primary Examiner* — Kevin K Pyo
(74) *Attorney, Agent, or Firm* — Chip Law Group

(57) ABSTRACT

The present disclosure relates to a solid-state imaging element and an electronic apparatus capable of suppressing color mixing and sensitivity reduction in each of pixels of a solid-state imaging element having a vertical spectral structure. A solid-state imaging element according to a first aspect of the present disclosure is a solid-state imaging element including a vertical spectral structure pixel containing a plurality of photoelectric conversion units stacked in layers. The vertical spectral structure pixel includes a first photoelectric conversion unit configured to generate an electric charge in accordance with light having a first wavelength among incident light, a second photoelectric conversion unit configured to generate an electric charge in accordance with light having a second wavelength among the incident light that has been transmitted through the first photoelectric conversion unit, and a first spectral unit formed on an upper (Continued)

surface of the first photoelectric conversion unit and configured to laterally bend a traveling direction of the light having the first wavelength of the incident light. The present disclosure is applicable to an electronic apparatus including an image sensor, for example.

16 Claims, 21 Drawing Sheets

(51) Int. Cl.
 *B82Y 15/00* (2011.01)
 *H01L 27/30* (2006.01)
 *H04N 5/369* (2011.01)

(52) U.S. Cl.
 CPC .. *H01L 27/14625* (2013.01); *H01L 27/14647* (2013.01); *H01L 27/307* (2013.01); *H01L 27/14627* (2013.01); *H04N 5/3696* (2013.01)

(58) Field of Classification Search
 USPC ............ 250/208.1, 214.1; 257/432, 436, 443
 See application file for complete search history.

(56) References Cited

U.S. PATENT DOCUMENTS

2014/0077324 A1    3/2014  Matsugai
2015/0325721 A1*  11/2015  Toda ................. H01L 27/14643
                                                          257/461

FOREIGN PATENT DOCUMENTS

| JP | 2011-138950 A | 7/2011 |
| JP | 2011-180426 A | 9/2011 |
| JP | 2013-093553 A | 5/2013 |
| JP | 2014-078673 A | 5/2014 |
| KR | 10-2011-0076770 A | 7/2011 |

* cited by examiner

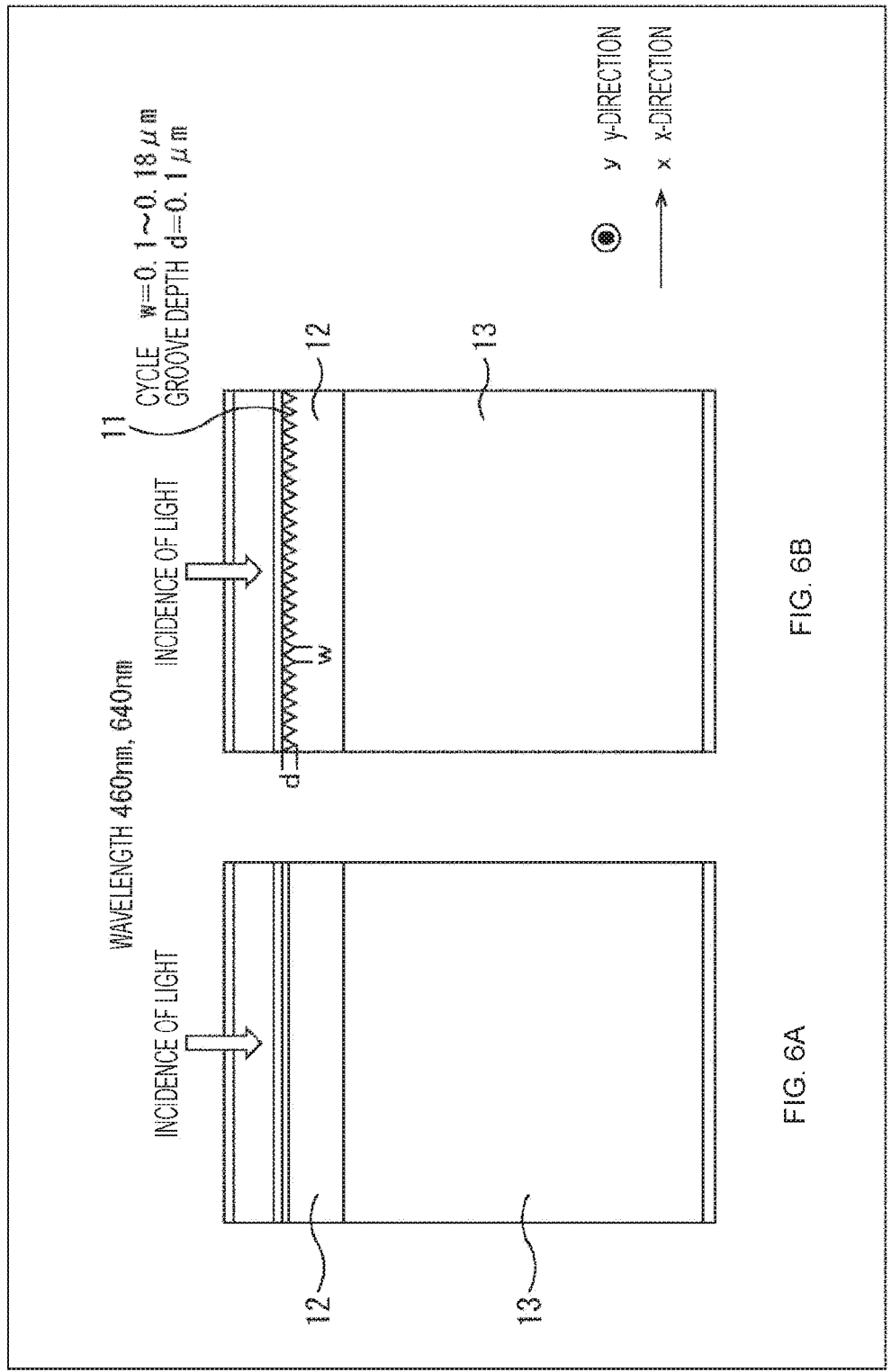

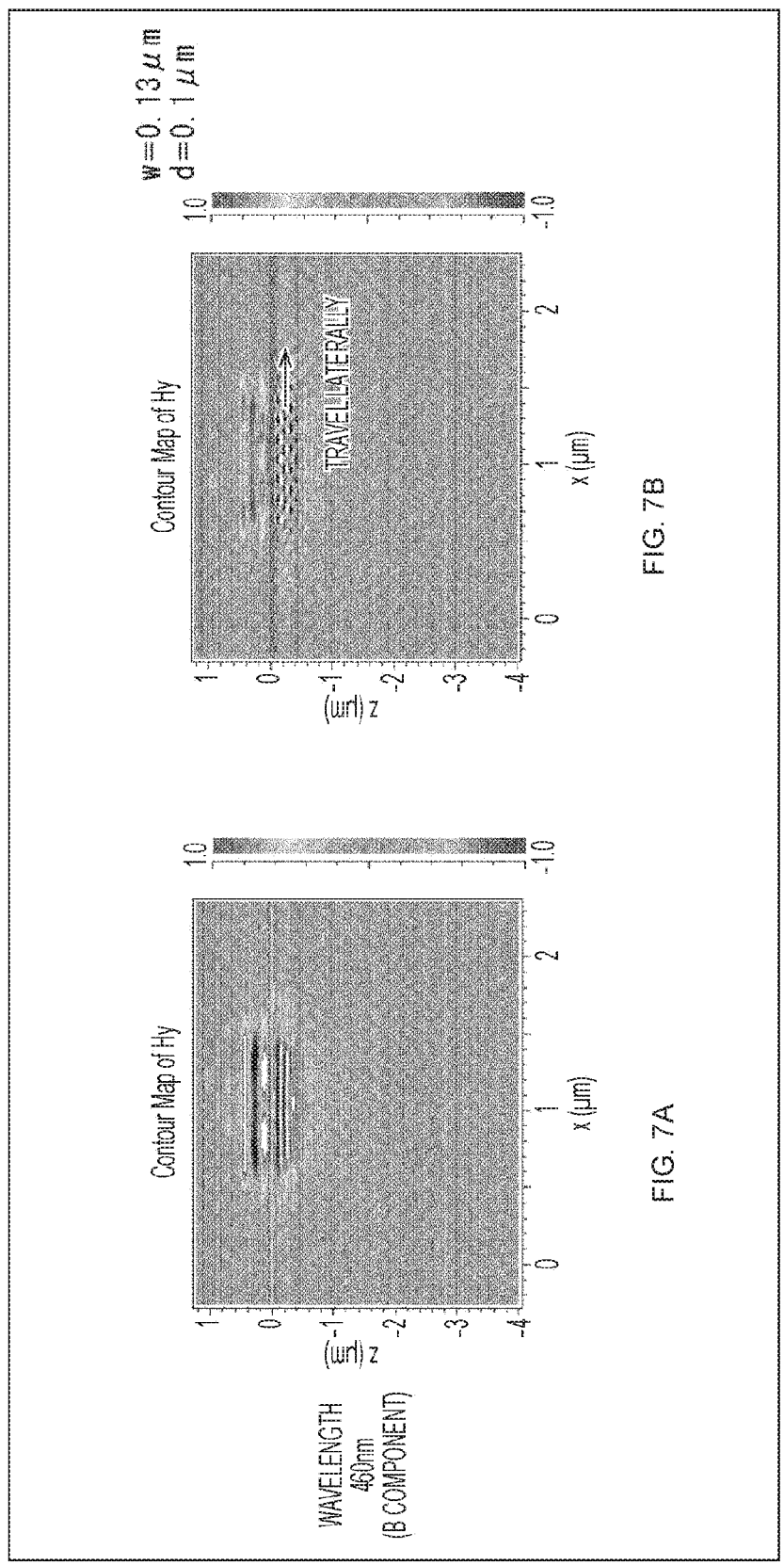

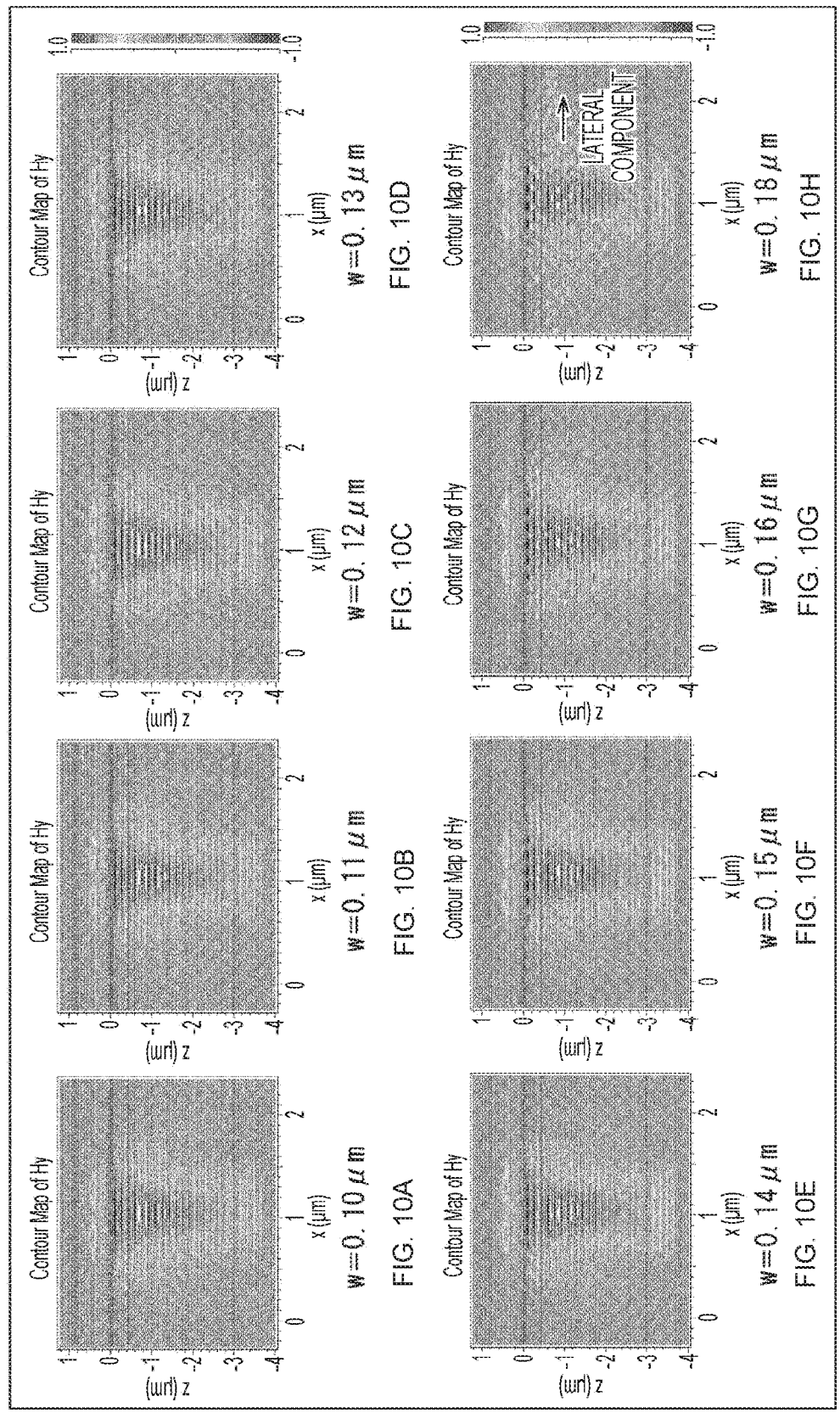

SOLID-STATE IMAGING ELEMENT AND ELECTRONIC APPARATUS

CROSS REFERENCE TO RELATED APPLICATIONS

This application is a U.S. National Phase of International Patent Application No. PCT/JP2016/054145 filed on Feb. 12, 2016, which claims priority benefit of Japanese Patent Application No. JP 2015-036248 filed in the Japan Patent Office on Feb. 26, 2015. Each of the above-referenced applications is hereby incorporated herein by reference in its entirety.

TECHNICAL FIELD

The present disclosure relates to a solid-state imaging element and an electronic apparatus, and particularly related to a solid-state imaging element and an electronic apparatus suitable for use in a case where each of pixels has a vertical spectral structure.

BACKGROUND ART

Conventionally, each of pixels in a solid-state imaging element includes a color filter colored with different colors such as R, G, and B, and a photoelectric conversion unit constituted with a photodiode (PD), or the like, generates an electric charge by photoelectric conversion in accordance with incident light input via the color filter. In this case, each of the pixels outputs a monochrome pixel signal corresponding to the color of the color filter.

In addition, recently, there is a proposed solid-state imaging element (refer to Patent Document 1, for example) including a vertical spectral configuration containing an organic photoelectric conversion film or a plurality of PDs vertically stacked in layers in a region of each of the pixels of the solid-state imaging element in order to enable each of the pixels to simultaneously output pixel signals of the plurality of colors.

FIG. 1 is a cross-sectional view illustrating an exemplary solid-state imaging element having a vertical spectral configuration. The solid-state imaging element includes an organic photoelectric conversion film 1 having selective sensitivity to a green (G) component of incident light, a first PD (B-PD) 2 having selective sensitivity to a blue (B) component, and a second PD (R-PD) 3 having selective sensitivity to a red (R) component, being stacked in layers in an order from the light incident side.

Ideally, on the solid-state imaging element, each of the G component, the B component, and the R component, among the incident light, is preferably absorbed and converted into an electric charge by each of the organic photoelectric conversion film 1, the first PD 2, and the second PD 3, respectively.

CITATION LIST

Patent Document

Patent Document 1: Japanese Patent Application Laid-Open No. 2013-93553

SUMMARY OF THE INVENTION

Problems to be Solved by the Invention

In practice, however, since the R component is incident on the second PD 3 after being transmitted through the first PD 2, and the B component which has not been absorbed (converted) by the first PD 2 is incident on the second PD 3, it is difficult to avoid color mixing due to the structure illustrated in FIG. 1. Additionally, such color mixing might induce insufficient sensitivity at the same time. This issue will be described with reference to FIG. 2.

FIG. 2 illustrates a spectral sensitivity characteristic of the solid-state imaging element illustrated in FIG. 1. Specifically, in the figure, a curve G illustrates a spectral sensitivity of the organic photoelectric conversion film 1, a curve B illustrates a spectral sensitivity of the first PD 2, and a curve R illustrates a spectral sensitivity of the second PD 3.

As indicated by the curve B, it is observed that the first PD 2 also absorbs the R component (in the vicinity of 550 nm to 700 nm) in addition to the B component which should be naturally absorbed. Similarly, as indicated by the curve R, it is observed that the second PD 3 also absorbs the B component (in the vicinity of 400 nm to 550 nm) in addition to the R component which should be naturally absorbed.

Deviation of the spectral characteristic of the solid-state imaging element from an ideal state in this manner might increase a matrix coefficient at a time of color correction calculation and might lead to image quality deterioration (SN ratio deterioration) by the color correction calculation.

The present disclosure is made in view of this circumstance and is intended to suppress color mixing and sensitivity reduction in each of the pixels of a solid-state imaging element having a vertical spectral structure.

Solutions to Problems

A solid-state imaging element according to a first aspect of the present disclosure is a solid-state imaging element including a vertical spectral structure pixel containing a plurality of photoelectric conversion units stacked in layers, in which the vertical spectral structure pixel includes a first photoelectric conversion unit configured to generate an electric charge in accordance with light having a first wavelength among incident light, a second photoelectric conversion unit configured to generate an electric charge in accordance with light having a second wavelength among the incident light that has been transmitted through the first photoelectric conversion unit, and a first spectral unit formed on an upper surface of the first photoelectric conversion unit and configured to laterally bend a traveling direction of the light having the first wavelength of the incident light.

The first spectral unit can bend the traveling direction of the light of the first wavelength of the incident light in an extending direction of the first photoelectric conversion unit.

The first spectral unit can allow incident light other than the incident light having the first wavelength to travel straight without changing the traveling direction of the light.

The first spectral unit can be a diffraction grating.

The first spectral unit can be one of a metal nanoparticle and a metal nanowire.

A layer thickness of the first photoelectric conversion unit can be formed to be thinner compared with a thickness of operation of the second photoelectric conversion unit.

The vertical spectral structure pixel can further include a third photoelectric conversion unit configured to generate an electric charge in accordance with light having a third wavelength among the incident light, the first photoelectric conversion unit can generate an electric charge in accordance with the light having the first wavelength that has been transmitted through the third photoelectric conversion unit and has a traveling direction bent by the first spectral unit, and the second photoelectric conversion unit can generate an electric charge in accordance with the light having the second wavelength among the incident light that has been transmitted through the third photoelectric conversion unit, the first spectral unit, and the first photoelectric conversion unit.

The first and second photoelectric conversion units can be PDs, and the third photoelectric conversion units can be an organic photoelectric conversion film.

The solid-state imaging element according to the first aspect of the present disclosure can further include a non-vertical spectral structure pixel including a third photoelectric conversion unit configured to generate an electric charge in accordance with light having the third wavelength among the incident light.

The first to third photoelectric conversion units can be PDs.

The non-vertical spectral structure pixel can further include a color filter configured to transmit solely the light of the third wavelength, on an upper surface of the third photoelectric conversion unit, and the vertical spectral structure pixel can further include a color filter configured to transmit solely the light having the first wavelength and the second wavelength, on an upper surface of the first spectral unit.

The vertical spectral structure pixel can further include a third photoelectric conversion unit configured to generate an electric charge in accordance with light having a third wavelength among incident light and can further include a second spectral unit formed on an upper surface of the third photoelectric conversion unit and configured to laterally bend a traveling direction of the light having the third wavelength of the incident light, and the third photoelectric conversion unit can generate an electric charge in accordance with the light having the third wavelength among the incident light that has been transmitted through the first spectral unit and the first photoelectric conversion unit, and the second photoelectric conversion unit can generate an electric charge in accordance with the light having the second wavelength among the incident light that has been transmitted through the first spectral unit, the first photoelectric conversion unit, the second spectral unit, and the third photoelectric conversion unit.

The second spectral unit can be one of a diffraction grating, a metal nanoparticle, and a metal nanowire.

The first to third photoelectric conversion units can be PDs.

The vertical spectral structure pixel can further include a light condensing unit configured to condense the incident light to a position in the vicinity of a center of the vertical spectral structure pixel.

The light having the first wavelength can be light of a B component, the light having the second wavelength can be light of an R component, and the light having the third wavelength can be light of a G component.

An electronic apparatus according to a second aspect of the present disclosure is an electronic apparatus including a solid-state imaging element including a vertical spectral structure pixel containing a plurality of photoelectric conversion units stacked in layers, in which the vertical spectral structure pixel includes a first photoelectric conversion unit configured to generate an electric charge in accordance with light having a first wavelength among incident light, a second photoelectric conversion unit configured to generate an electric charge in accordance with light having a second wavelength among the incident light that has been transmitted through the first photoelectric conversion unit, and a first spectral unit formed on an upper surface of the first photoelectric conversion unit and configured to laterally bend a traveling direction of the light having the first wavelength of the incident light.

According to the first and second aspects of the present disclosure, the vertical spectral structure pixel is configured such that the traveling direction of the light having the first wavelength of the incident light is bent laterally, and an electric charge is generated in accordance with the light having the first wavelength.

Effects of the Invention

According to the first and second aspects of the present disclosure, it is possible to suppress color mixing and sensitivity reduction in each of the pixels.

BRIEF DESCRIPTION OF DRAWINGS

FIGS. 6A and 6B are diagrams illustrating a configuration of a solid-state imaging element adopted for wave simulation.

FIGS. 7A and 7B are diagrams illustrating a result of wave simulation in a case where the incident light wavelength is 460 nm.

FIGS. 10A, 10B, 10C, 10D, 10E, 10F, 10G and 10H are diagrams illustrating a result of wave simulation in a case where the incident light wavelength is 640 nm and the cycle of the diffraction grating is changed.

MODE FOR CARRYING OUT THE INVENTION

Hereinafter, best modes (hereinafter referred to as embodiments) for implementing the present disclosure will be described in detail with reference to the drawings.

Outline of Present Embodiment

Figure 1:
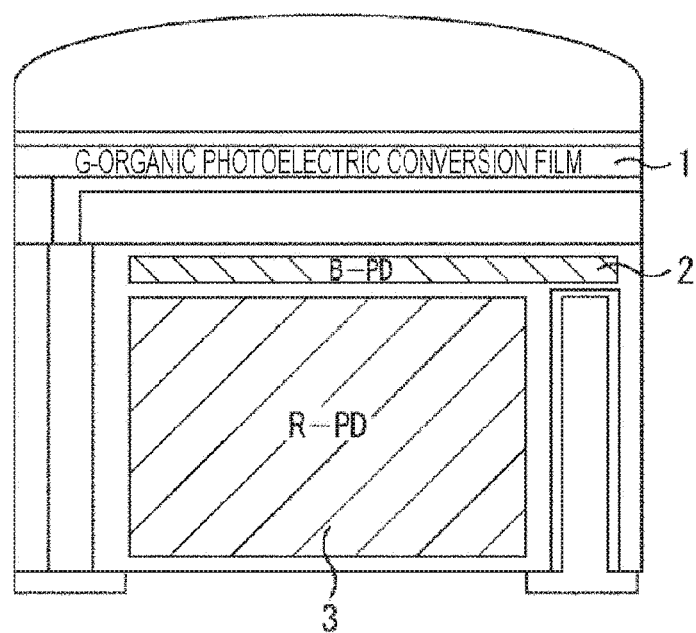
FIG. 1 is a cross-sectional view illustrating an exemplary configuration of a solid-state imaging element having a conventional vertical spectral structure.
Figure 2:
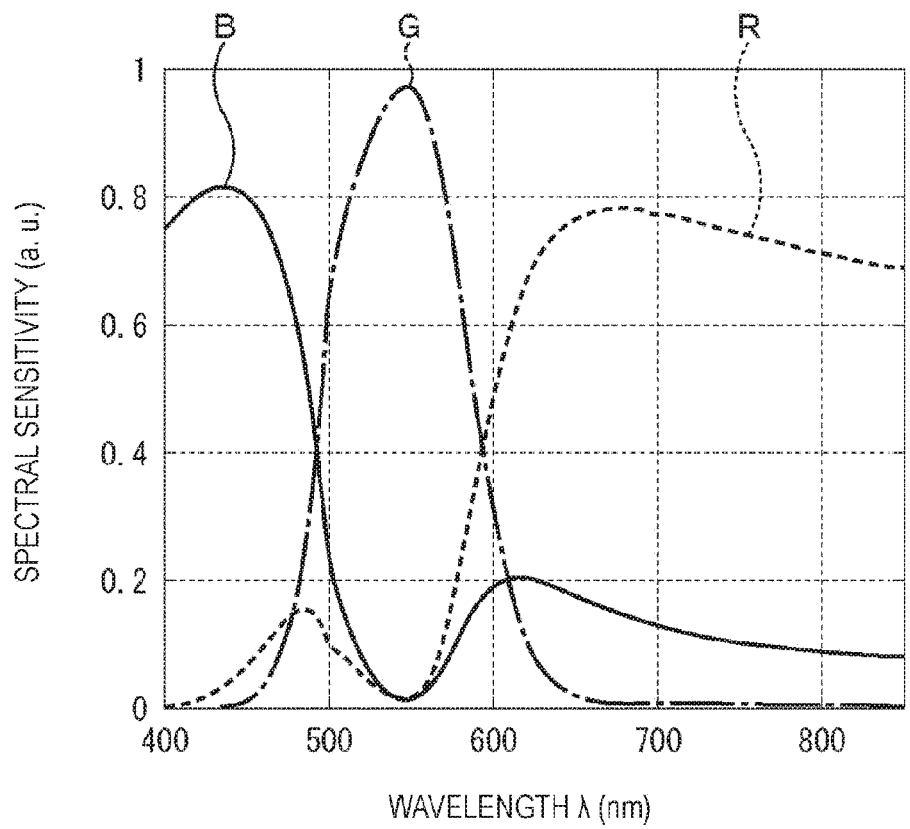
FIG. 2 is a diagram illustrating a spectral sensitivity characteristic of the solid-state imaging element illustrated in FIG. 1.
Figure 3:
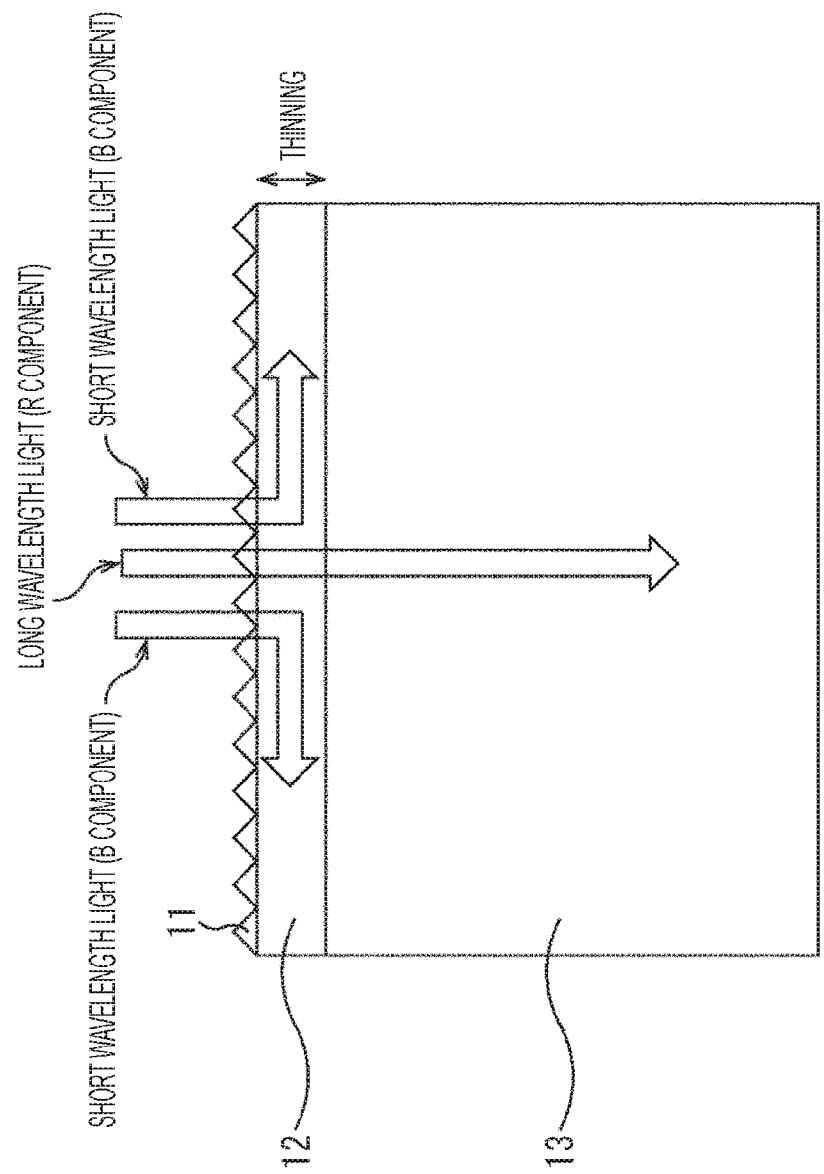
FIG. 3 is a schematic cross-sectional view of a solid-state imaging element having a vertical spectral structure according to the present disclosure.

FIG. 3 is a schematic cross-sectional view of a solid-state imaging element having a vertical spectral structure according to the present disclosure.

This solid-state imaging element includes a diffraction grating 11, a first PD 12, and a second PD 13, being vertically stacked in layers in an order from the light incident side. Note that, although not illustrated, an on-chip lens for condensing incident light to a position in the vicinity of the pixel center is formed on an upper surface side of the diffraction grating 11, and an organic photoelectric conversion film configured to absorb the green (G) component of the incident light and convert it into an electric charge is formed between the diffraction grating 11 and the on-chip lens.

The diffraction grating 11 horizontally (laterally) diffracts light having a predetermined wavelength corresponding to a cycle w of arrangement of a scatterer constituting the diffraction grating 11 among the incident light. Light having the other wavelength is transmitted without being diffracted. The cycle w of the diffraction grating 11 is set so as to diffract light having a wavelength to be absorbed by the first PD 12 and to transmit light having a wavelength to be absorbed by the second PD 13.

The first PD 12 absorbs short wavelength light such as the blue (B) component and converts the light into an electric charge. The second PD 13 absorbs long wavelength light such as a red (R) component and converts the light into an electric charge. Note that the layer thickness of the first PD 12 is designed to be thinner compared with a conventional case.

On the solid-state imaging element, when light is incident, the B component of the light is laterally diffracted by the diffraction grating 11, absorbed by the first PD 12, and converted into an electric charge. At this time, the B component travels in a direction in which the first PD 12 extends, and thus, does not leak to the second PD 13. Moreover, since an optical path length of the B component in the first PD 12 is longer compared with the layer thickness, it is possible to allow the B component to be efficiently absorbed by the first PD 12. Although not illustrated, it is allowable to block leakage light by providing a reflection plate or a light absorbing film at a boundary between the pixels in order to avoid color mixing to an adjacent pixel.

Meanwhile, the R component that has not been diffracted by the diffraction grating 11 among the incident light is transmitted through the first PD 12, absorbed by the second PD 13, and then, converted into an electric charge. Note that, since the optical path length at the time of transmission of the R component through the first PD 12 (that is, the layer thickness of the first PD 12) is shorter compared with the conventional case, it is possible to reduce the amount of absorption of the R component by the first PD 12.

Figure 4:
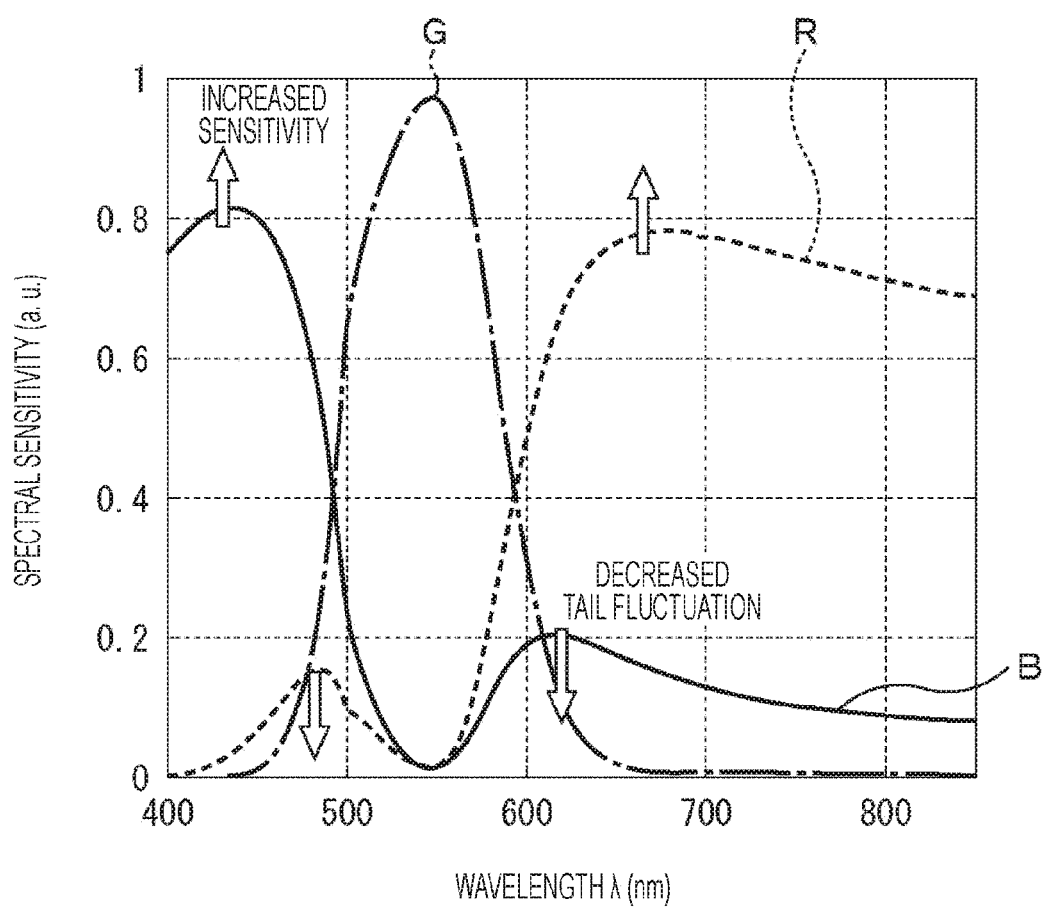
FIG. 4 is a diagram illustrating a spectral sensitivity characteristic that can be expected on the solid-state imaging element illustrated in FIG. 3.

FIG. 4 illustrates a spectral sensitivity characteristic that can be expected for the solid-state imaging element illustrated in FIG. 3. Specifically, in the figure, each of the curve G, the curve B, and the curve R illustrates a spectral characteristic expected for an organic photoelectric conversion film (not illustrated), for the first PD 12, and for the second PD 13, respectively.

As illustrated in FIG. 4, it is expected on the solid-state imaging element illustrated in FIG. 3, that the sensitivity of the first PD 12 to the B component increases and absorption of the R component (in the vicinity of 550 nm to 700 nm) by the first PD 12 decreases, as indicated by the curve B. Similarly, as indicated by the curve R, it is expected that the sensitivity of the second PD 13 to the R component increases and absorption of the B component (in the vicinity of 400 nm to 550 nm) by the second PD 13 decreases.

Action of Diffraction Grating

Next, action of the diffraction grating will be described.

Figure 5:
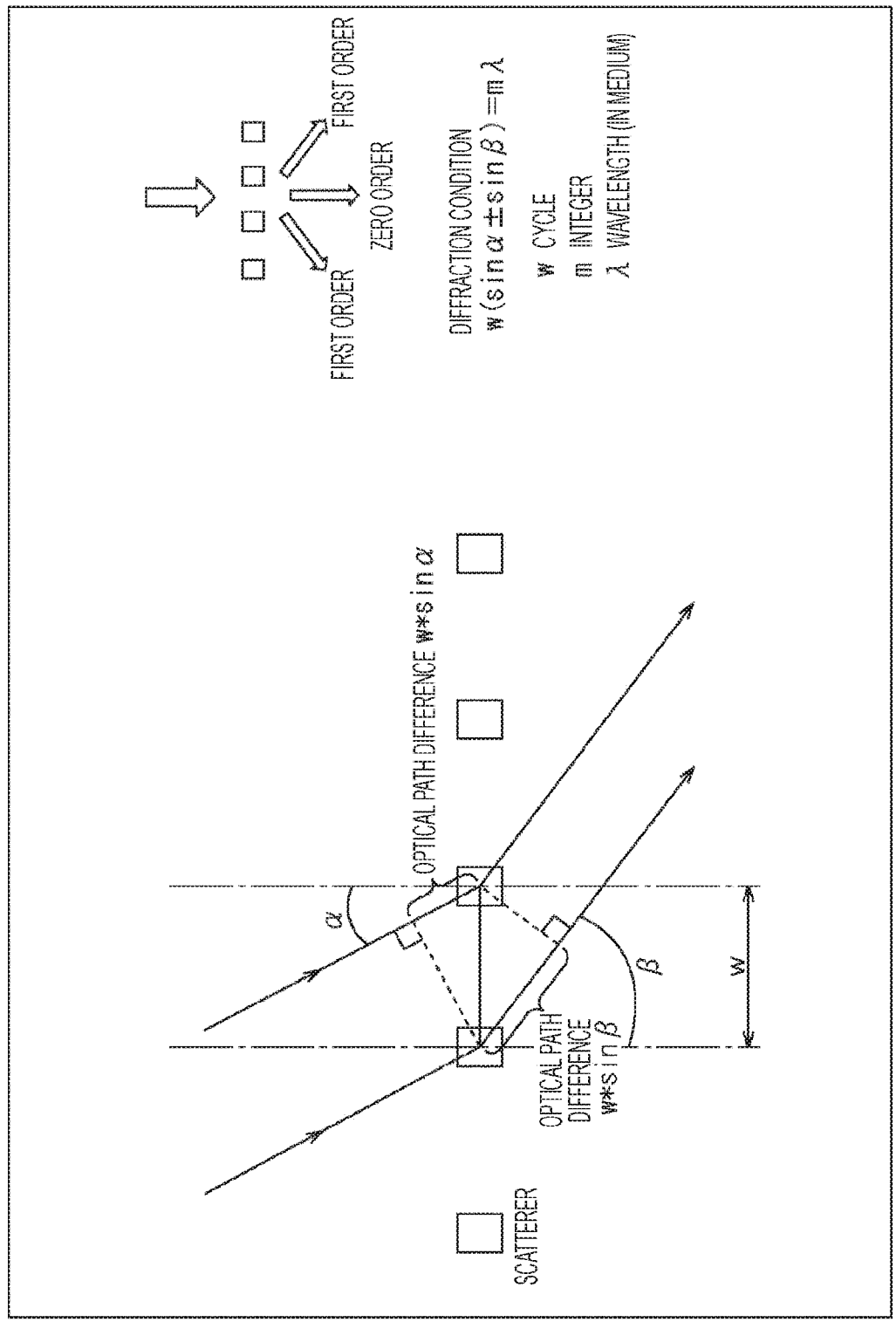
FIG. 5 is a diagram for illustrating a diffraction condition of a diffraction grating.

FIG. 5 illustrates an exemplary diffraction grating. Herein, a plurality of scatterers constituting the diffraction grating is arranged at a cycle w, and incident light is incident at an angle α. In this case, a plurality of scattered light rays generates interference, in which as illustrated in the figure, an optical path difference between two adjacent light rays is w·sin α on the incident side, and the optical path difference on an emission side is w·sin β. Accordingly, a condition for intensifying each other by interference is expressed by the following Formula (1) in view of the minus β side on the emission side.

$$w \cdot (\sin \alpha \pm \sin \beta) = m \cdot \lambda \quad (1)$$

Here, m is a diffraction order represented by an integer of zero or more, and λ is a wavelength in a medium. In a case where the wavelength in the vacuum is λ0, then, the wavelength λ in the medium is λ0/n. Where, n is a refractive index of the medium.

Note that, in the case of a solid-state imaging element, light is incident substantially vertically, leading to angle α≈0°. In order to diffract the incident light to allow it to travel laterally, the angle β would be approximately 90°. In a case where a diffraction order m is in the 0th order, the light, being entirely transmitted light, travels straight vertically. In contrast, diffraction occurs when the order is the first order or higher. At this time, the order having the highest diffraction efficiency is the first order (m=1). Therefore, by applying these values to Formula (1), Formula (1) can be transformed into Formula (2).

$$w \approx \lambda 0/n \quad (2)$$

In a case where a semiconductor serving as the medium is assumed to be Si, the refractive index n of light in a wavelength range from 400 nm to 500 nm on Si is in a range of 4 to 5. Accordingly, in order to satisfy Formula (2), the cycle w=100 nm to 200 nm.

Next, an effect of the diffraction grating will be described using wave simulation of a finite-difference time-domain method (FDTD).

FIGS. 6A and 6B illustrate a configuration example of a solid-state imaging element adopted for wave simulation.

FIG. 6A illustrates a conventional configuration example including the first PD 12 and the second PD 13 stacked in layers within the Si substrate, without the diffraction grating 11. FIG. 6B illustrates a configuration example according to the present disclosure including the first PD 12 and the second PD 13 stacked in layers within the Si substrate and including the diffraction grating 11 on the second PD 13. Note that herein the first PD 12 absorbs short wavelength light such as the B component while the second PD 13 absorbs long wavelength light such as the R component.

In the wave simulation, the wavelength of the incident light is 460 nm (B component) and 640 nm (R component), while the cycle w of the diffraction grating 11 is 0.1 μm to 0.18 μm (100 nm to 180 nm), with a groove depth d being 0.1 μm.

FIGS. 7A and 7B illustrate a simulation result in a case where the wavelength of the incident light is 460 nm. FIG. 7A illustrates a case where the diffraction grating 11 is not provided, while FIG. 7B illustrates a case where the diffraction grating 11 is provided. Note that the layer thickness of the first PD 12 is 0.6 μm, and the cycle w of the diffraction grating 11 is 0.13 μm.

Figures 8A, 8B:
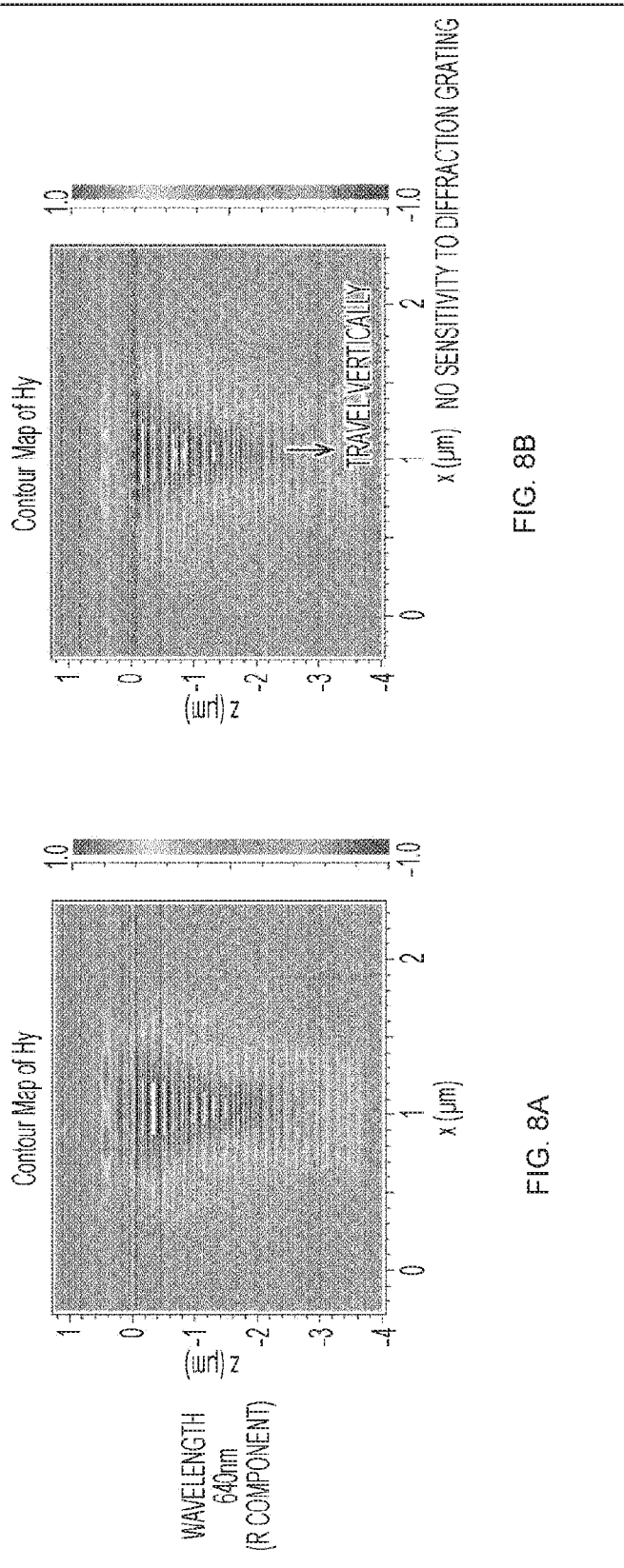
FIGS. 8A and 8B are diagrams illustrating a result of wave simulation in a case where the incident light wavelength is set to 640 nm.

Similarly, FIGS. 8A and 8B illustrate a simulation result in a case where the wavelength of the incident light is 640 nm. FIG. 8A illustrates a case where the diffraction grating 11 is not provided, while FIG. 8B illustrates a case where the diffraction grating 11 is provided. Note that the layer thickness of the first PD 12 is 0.6 μm, and the cycle w of the diffraction grating 11 is 0.13 μm.

From the results illustrated in FIG. 7A and FIG. 8A, it is observed that both the B component and the R component travel straight vertically in the Si substrate in a case where the diffraction grating 11 is not provided. In contrast, it is observed that the B component is diffracted and travels laterally in the first PD 12 and the R component travels straight vertically in a case where the diffraction grating 11 is provided, from the results illustrated in FIG. 7B and FIG. 8B. This is because the diffraction condition is satisfied for the B component and the diffraction condition is not satisfied for the R component. Note that the absorption coefficient is large in the case of the B component, and thus, an effect of color mixing to an adjacent pixel would be small even when the B component travels laterally. Although not illustrated, it is allowable to block leakage light by providing a reflection plate or a light absorbing film at a boundary between individual pixels in order to avoid color mixing to the adjacent pixel.

Figure 9:
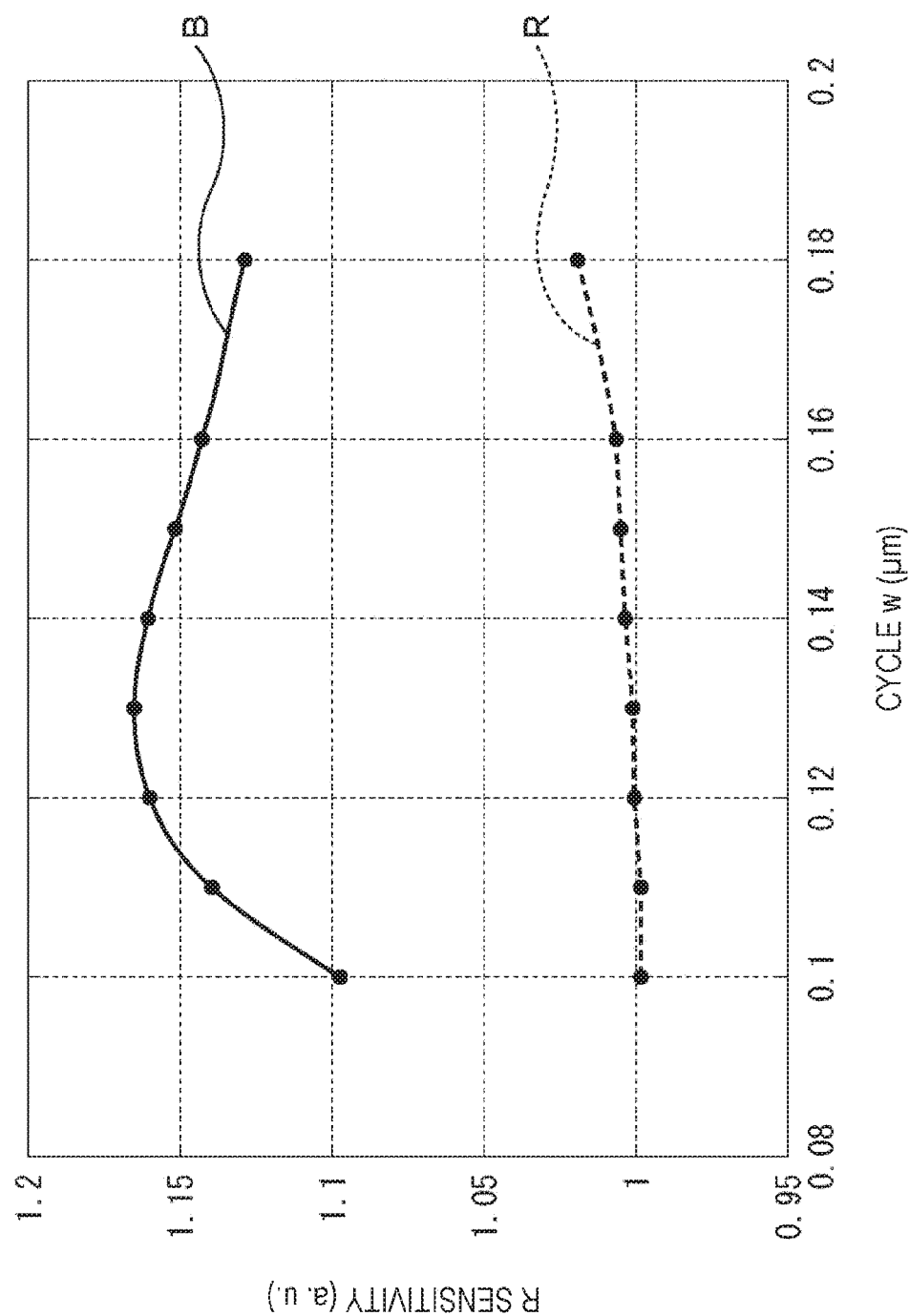
FIG. 9 is a diagram illustrating the cycle dependence of the sensitivity increase rate.

Next, FIG. 9 illustrates a sensitivity increase rate in light absorption on the first PD 12 (curve B) and the second PD 13 (curve R) in a case where the cycle w of the diffraction grating 11 is changed. Herein, note that the sensitivity increase rate in a case where the diffraction grating 11 is not provided is one. Herein, note that in the case of this figure, the diffraction grating 11 is provided in the xy direction.

As illustrated in the figure, in a case where the diffraction grating 11 is provided, the sensitivity remarkably increases in the first PD 12 configured to absorb the B component, and the sensitivity of the first PD 12 becomes maximum with a sensitivity increase by about 17% particularly in a case where the cycle w=0.13 μm. This is considered to have resulted from the increased optical path length due to the fact that the B component travels laterally by diffraction by the diffraction grating 11. In contrast, the R component travels vertically without diffraction, and thus, there is no noticeable change in the sensitivity even with cycle w=0.13 μm.

Meanwhile, it is known that diffraction occurs even in the R component in a case where the cycle w of the diffraction grating 11 is increased. However, since an absorption coefficient of the R component is small for the Si material constituting the PD, traveling laterally would generate color mixing to adjacent pixels, and would adversely affect the image quality. Accordingly, there is a need to provide an appropriate range for the cycle w of the diffraction grating 11.

Next, an optimum range of the cycle w of the diffraction grating 11 will be described. FIGS. 10A, 10B, 10C, 10D, 10E, 10F, 10G and 10H illustrates a result of wave simulation when the wavelength of the incident light is 640 nm and the cycle w of the diffraction grating 11 is varied from 0.1 μm to 0.18 μm. The cycle w is increased by 0.01 μm in each of FIGS. 10A, 10B, 10C, 10D, 10E, 10F, 10G and 10H.

As observed from the figure, the R component has not substantially diffracted laterally in a range of cycle w from 0.1 μm to 0.16 μm, while the R component diffracts laterally when the cycle w is 0.18 μm. Accordingly, it is reasonable to determine that the optimum range of the cycle w needed to prevent the R component from being mixed with adjacent pixels would be 0.1 μm to 0.16 μm.

Next, color mixing within a same pixel will be described with reference to FIGS. 11A and 11B.

Figures 11A, 11B:
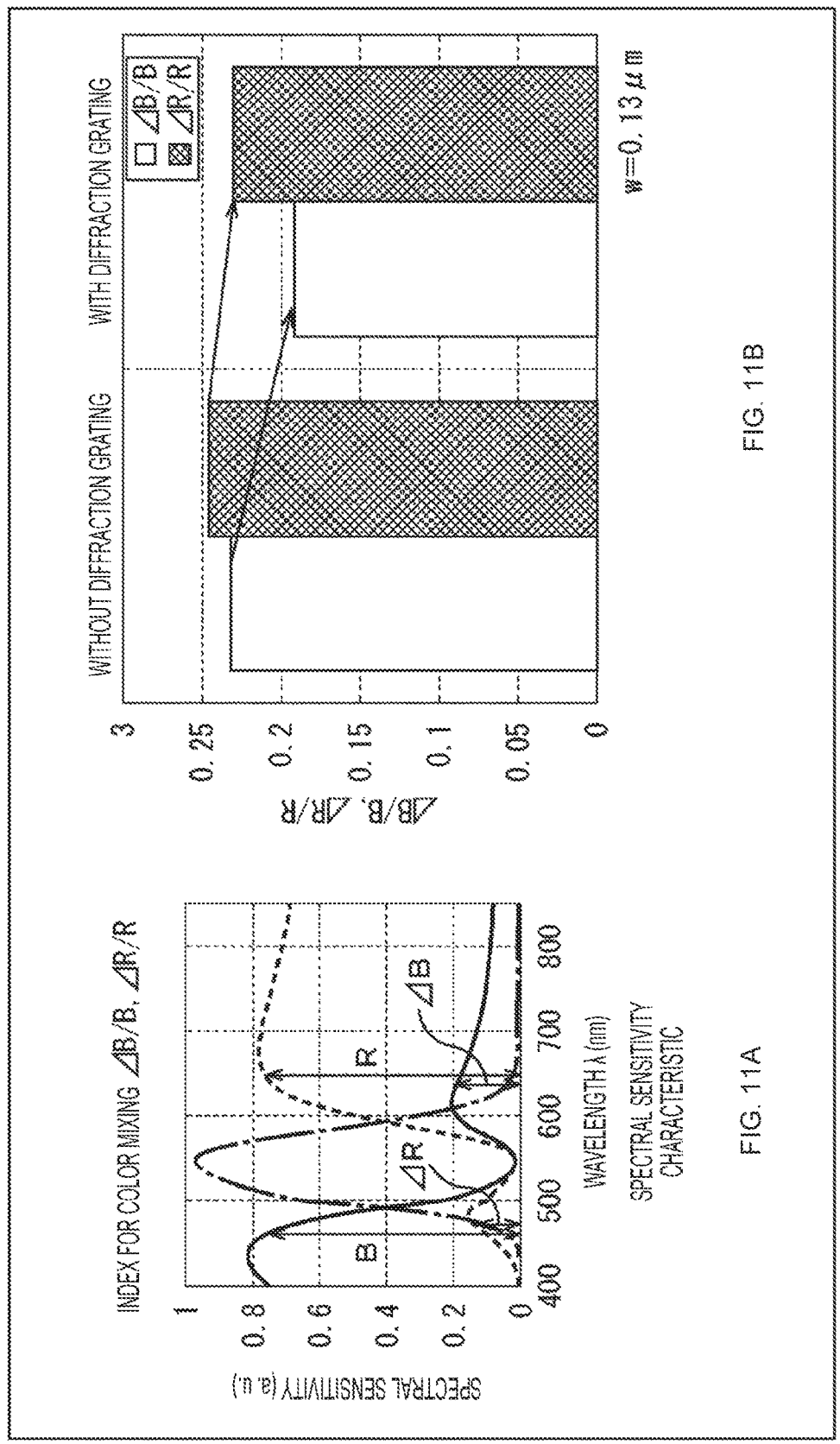
FIGS. 11A and 11B are diagrams illustrating an index of color mixing in a same pixel.

FIG. 11A illustrates values B, ΔB, R and ΔR to be used in defining indices of color mixing in the same pixel. Specifically, as illustrated in FIG. 11A, the value B is the sensitivity of the first PD 12 to light having a wavelength of 460 nm, the value ΔB is the sensitivity of the first PD 12 to light having a wavelength of 640 nm, the value R is the sensitivity of the second PD 13 to light having a wavelength of 640 nm, and the value ΔR is the sensitivity of the second PD 13 to light having a wavelength of 460 nm. Hereinafter, a value ΔB/B will be defined as an index of color mixing on the first PD 12, and a value ΔR/R will be defined as an index of color mixing on the second PD 13.

In this manner, by defining values as indices of color mixing, it is possible to quantitatively evaluate color mixing. Meanwhile, in view of signal processing in color correction calculation, setting the absolute value of the matrix coefficient as small as possible would reduce noise propagation after the calculation and suppress deterioration of the SN ratio. In order to achieve this, it is appropriate to bring the spectral characteristic closer to an ideal spectrum, and the index can be an appropriate index from the fact that this index represents a spectral shape.

A left portion of FIG. 11B illustrates indices ΔB/B and ΔR/R of color mixing in a case where the diffraction grating 11 illustrated in FIG. 6A is not provided, while a right portion of FIG. 11B illustrates indices ΔB/B and ΔR/R of color mixing in a case where the diffraction grating 11 (cycle w is 0.13 μm) illustrated in FIG. 6B is provided.

As observed from FIG. 11B, both the indexes ΔB/B and ΔR/R decrease in a case where the diffraction grating 11 is provided compared with the case where the diffraction grating 11 is not provided. This indicates reduction of the color mixing. The reason why the index ΔB/B decreases is considered to be due to the fact that an increase in the absorption of light having a wavelength of 460 nm on the first PD 12 also increases the value B as a denominator of the index ΔB/B. The reason why the index ΔR/R decreases is considered to be due to the fact that a decrease in the light having a wavelength of 460 nm that reaches the second PD 13 decreases the absorption on the second PD 13, leading to a decrease in the value ΔR as a numerator of the index ΔR/R.

From the above result, it is observed that providing the diffraction grating 11 enables reduction of color mixing in the same pixel. This makes it possible to reduce noise propagation after signal processing of color correction calculation and to suppress deterioration of the SN ratio.

Thinning of First PD 12

Next, an effect of reducing the layer thickness of the first PD 12 will be described.

Figure 12:
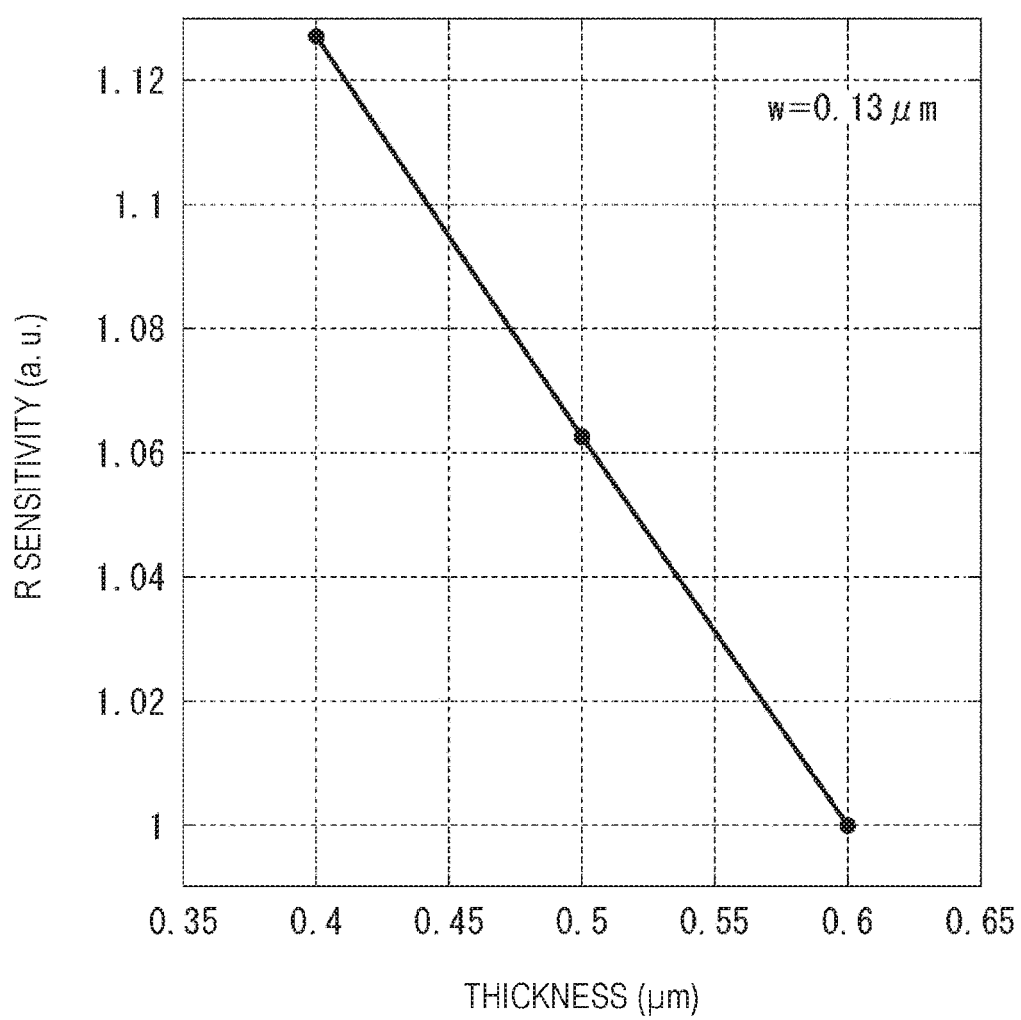
FIG. 12 is a diagram illustrating a change in sensitivity with respect to a change in a thickness of a first PD.
Figure 13:
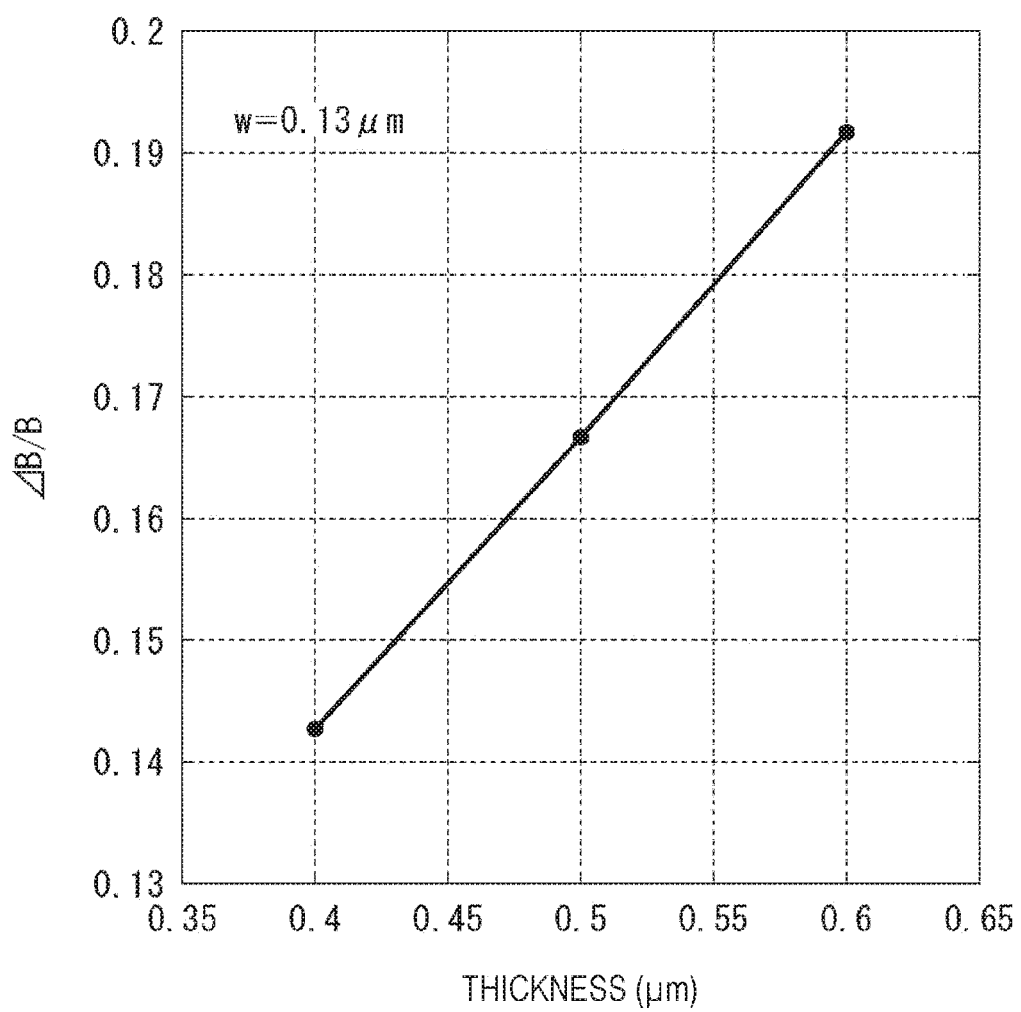
FIG. 13 is a diagram illustrating a change in an index of color mixing with respect to a change in the thickness of the first PD.

FIG. 12 illustrates the sensitivity to the R component (wavelength 640 nm) in the second PD 13 for a case where the layer thickness of the first PD 12 is varied in a range of 0.4 µm to 0.6 µm. FIG. 13 illustrates an index ΔB/B of mixed color in the first PD 12 for a case where the layer thickness of the first PD 12 is varied in the range of 0.4 µm to 0.6 µm. Note that the cycle w of the diffraction grating 11 in FIGS. 12 and 13 is 0.13 µm.

As observed from FIGS. 12 and 13, the more the layer thickness of the first PD 12, the higher the sensitivity to the R component of the second PD 13 and the lower the index ΔB/B of color mixing in the first PD 12. This is considered to be due to the fact that the shortened optical path length when the R component is transmitted through the first PD 12 decreases the absorption, and thus, the absorption of the R component in the second PD 13 is increased accordingly. Consequently, by providing the diffraction grating 11 and in addition to this, thinning the layer thickness of the first PD 12, it is possible to further enhance the spectral sensitivity characteristic.

Figure 14:
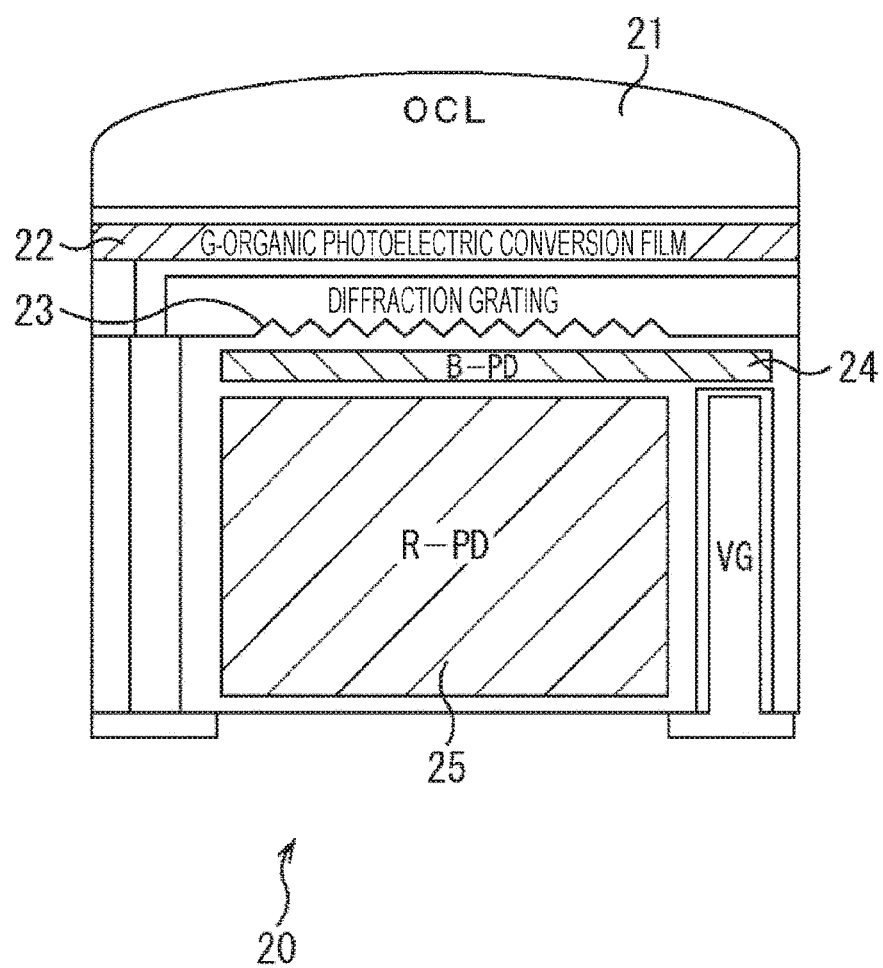
FIG. 14 is a cross-sectional view illustrating a first configuration example of a solid-state imaging element according to an embodiment of the present disclosure.

First Configuration Example of Solid-State Imaging Element According to an Embodiment of Present Disclosure Next, FIG. 14 illustrates a first configuration example of the solid-state imaging element according to an embodiment of the present disclosure.

A solid-state imaging element 20 includes an on-chip lens (OCL) 21, an organic photoelectric conversion film 22, a diffraction grating 23, a first PD (B-PD) 24, and a second PD (R-PD) 25, being stacked in layers in an order from the light incident side. Note that, while each of the organic photoelectric conversion film 22, the first PD 24, and the second PD 25 includes an electrode, detailed description thereof will be omitted.

The on-chip lens 21 condenses the incident light to a position in the vicinity of the pixel center. The organic photoelectric conversion film 22 absorbs the light of a G component of the incident light and converts the light into an electric charge. The diffraction grating 23 laterally diffracts the B component among the incident light transmitted through the organic photoelectric conversion film 22, and allows the other components to travel straight. Herein, note that the cycle w of the diffraction grating 23 is in a range of 0.1 µm to 0.16 µm, for example, 0.13 µm (130 nm), and the groove depth d is 100 nm, for example.

The first PD 24 absorbs the B component diffracted by the diffraction grating 23 and converts it into an electric charge. Note that the first PD 24 is formed to have a layer thickness of 0.6 µm or less, for example, 0.5 µm. The second PD 25 absorbs the R component of the incident light transmitted through the first PD 24 and converts it into an electric charge. The second PD 25 is formed to have a layer thickness of 2.5 µm, for example.

On the solid-state imaging element 20, incident light is condensed to the position in the vicinity of the pixel center by the on-chip lens 21, and initially, the light of the G component of the incident light is absorbed by the organic photoelectric conversion film 22 and converted into an electric charge. Next, the B component of the incident light transmitted through the organic photoelectric conversion film 22 is diffracted laterally by the diffraction grating 23, absorbed by the first PD 24, and converted into an electric charge. The R component of the incident light traveling straight without being diffracted by the diffraction grating 23 is absorbed by the second PD 25 and converted into an electric charge. Although not illustrated, it is allowable to block leakage light by providing a reflection plate or a light absorbing film at a boundary between the pixels in order to avoid color mixing to an adjacent pixel.

The solid-state imaging element 20 includes the diffraction grating 23 having scatterers arranged at an appropriate cycle and further includes the first PD 24 formed in thinned layers, making it possible to suppress structurally unavoidable color mixing for each of the pixels and to suppress sensitivity reduction in each of the color components. Moreover, since the photo sensitivity characteristic of each of the pixels of the solid-state imaging element 20 is brought closer to an ideal spectrum, the matrix coefficient of color correction calculation at a subsequent stage of the solid-state imaging element 20 is suppressed to be a low level, making it possible to achieve an image with high image quality and suppressed deterioration of the SN ratio.

Figures 15A, 15B:
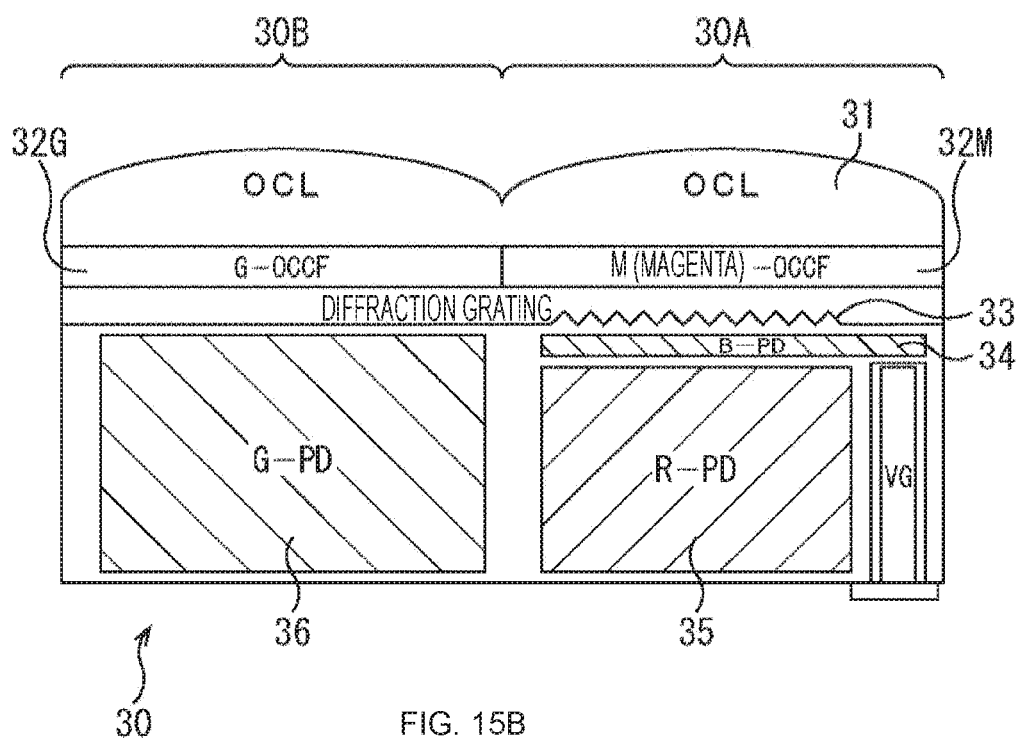
FIGS. 15A and 15B are cross-sectional views illustrating a second configuration example of a solid-state imaging element according to an embodiment of the present disclosure.

Second Configuration Example of Solid-State Imaging Element According to Embodiment of Present Disclosure Next, FIGS. 15A and 15B illustrate a second configuration example of the solid-state imaging element according to an embodiment of the present disclosure.

As illustrated in A of the figure, a solid-state imaging element 30 includes a first pixel 30A and a second pixel 30B in a checkered pattern. The first pixel 30A simultaneously outputs pixel signals of the B component and the R component. The second pixel 30B outputs a pixel signal of the G component.

Moreover, as illustrated in B of the figure, the first pixel 30A includes an on-chip lens 31, an on-chip color filter (OCCF) 32M colored with magenta, a diffraction grating 33, a first PD (B-PD) 34, and a second PD (R-PD) 35, being stacked in layers in an order from the light incident side. The second pixel 30B includes the on-chip lens 31, an on-chip color filter 32G colored with green (G), and a third PD (G-PD) 36, being stacked in layers in an order from the light incident side.

Note that, while each of the first PD 34, and the second PD 35, and the third PD 36 includes an electrode, detailed description thereof will be omitted.

The on-chip lens 31 condenses the incident light to a position in the vicinity of the pixel center. The on-chip color filter 32 is colored in magenta or G in a unit of pixel. The diffraction grating 33 laterally diffracts the B component among the incident light transmitted through the on-chip color filter 32M, and allows the other components to travel straight. Herein, note that the cycle w of the diffraction grating 33 is in a range of 0.1 µm to 0.16 µm, for example, 0.13 µm (130 nm), and the groove depth d is 100 nm, for example.

The first PD 34 absorbs the B component diffracted by the diffraction grating 33 and converts it into an electric charge. Note that the first PD 34 is formed to have a layer thickness of be 0.6 µm or less, for example, 0.5 µm. The second PD 35 absorbs the R component of the incident light transmitted through the first PD 34 and converts it into an electric charge. The second PD 35 is formed to have a layer thickness of 2.5 µm, for example. The third PD 36 absorbs the G component of the incident light transmitted through the on-chip color filter 32G and converts it into an electric charge.

On the first pixel 30A of the solid-state imaging element 30, the incident light is condensed to the position in the vicinity of the pixel center by the on-chip lens 31, and then, the B component of the incident light transmitted through the on-chip color filter 32M is diffracted laterally by the diffraction grating 33 and absorbed by the first PD 34, and converted into an electric charge. The R component of the incident light traveling straight without being diffracted by the diffraction grating 33 is absorbed by the second PD 35 and converted into an electric charge. Although not illustrated, it is allowable to block leakage light by providing a reflection plate or a light absorbing film at a boundary between the pixels in order to avoid color mixing to an adjacent pixel.

In contrast, on the second pixel 30B, the incident light is condensed at a position around the center of the pixel by the on-chip lens 31, and then, the G component of the incident light transmitted through the on-chip color filter 32G is absorbed by the third PD 36 and converted into an electric charge.

The first pixel 30A of the solid-state imaging element 30 includes the diffraction grating 33 having scatterers arranged at an appropriate cycle and further includes the first PD 34 formed in thinned layers, making it possible to suppress structurally unavoidable color mixing for each of the pixels and to suppress sensitivity reduction in each of the color components. Moreover, since the photo sensitivity characteristic of each of the pixels of the solid-state imaging element 30 is brought closer to an ideal spectrum, the matrix coefficient of color correction calculation at a subsequent stage of the solid-state imaging element 30 is suppressed to be a low level, making it possible to achieve an image with high image quality and suppressed deterioration of the SN ratio.

Figure 16:
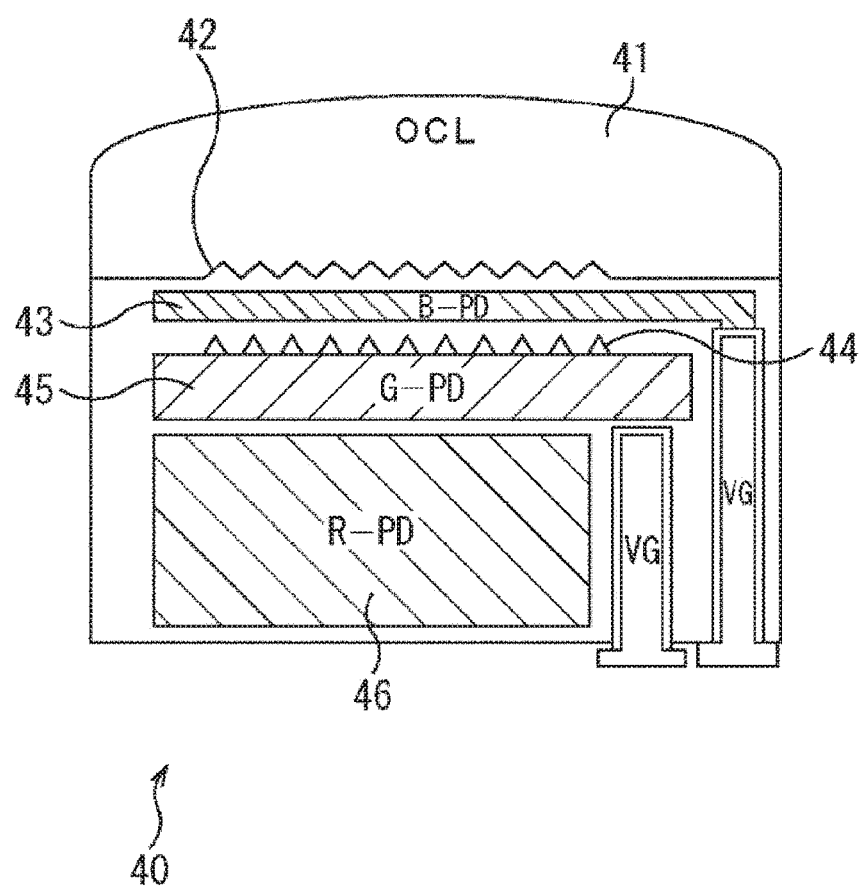
FIG. 16 is a cross-sectional view illustrating a third configuration example of a solid-state imaging element according to an embodiment of the present disclosure.

Third Configuration Example of Solid-State Imaging Element According to Embodiment of Present Disclosure Next, FIG. 16 illustrates a third configuration example of the solid-state imaging element according to an embodiment of the present disclosure.

A solid-state imaging element 40 includes an on-chip lens 41, a B diffraction grating 42, a first PD (B-PD) 43, a G diffraction grating 44, a second PD (G-PD) 45, and a third PD (R-PD) 46, being stacked in layers in an order from the light incident side.

Note that, while each of the first PD 43, and the second PD 45, and the third PD 46 includes an electrode, detailed description thereof will be omitted.

The on-chip lens 41 condenses the incident light to a position in the vicinity of the pixel center. The B diffraction grating 42 laterally diffracts the B component among the incident light and allows the other components to travel straight. Herein, note that the cycle w of the B diffraction grating 42 is in a range of 0.1 µm to 0.16 µm, for example, 0.13 µm (130 nm), and the groove depth d is 100 nm, for example. The first PD 43 absorbs the B component diffracted by the B diffraction grating 33 and converts it into an electric charge. Note that the first PD 43 is formed to have a layer thickness of 0.6 µm or less, for example, 0.5 µm.

The G diffraction grating 44 laterally diffracts the G component among the incident light and allows the other components to travel straight. Herein, note that the cycle w of the G diffraction grating 44 is in a range of 0.1 µm to 0.16 µm, for example, 0.15 µm (150 nm), and the groove depth d is 100 nm, for example. The second PD 45 absorbs the G component diffracted by the G diffraction grating 44 and converts it into an electric charge. The second PD 45 is formed to have a layer thickness of 1.8 µm, for example.

The third PD 46 absorbs the R component of the incident light transmitted through the first PD 43 and the second PD 45 and converts it into an electric charge. The third PD 46 is formed to have a layer thickness of 2.6 µm, for example.

On the solid-state imaging element 40, the incident light is condensed to a position in the vicinity of the pixel center by the on-chip lens 41, and then, the B component is laterally diffracted by the B diffraction grating 42 and absorbed by the first PD 34, and then, converted into an electric charge. The G component of the incident light traveling straight without being diffracted by the diffraction grating 33 is laterally diffracted by the G diffraction grating 44 and is absorbed by the second PD 45 and converted into an electric charge. Furthermore, the R component of the incident light transmitted through the first PD 43 and the second PD 45 is absorbed by the third PD 46 and converted into an electric charge. Although not illustrated, it is allowable to block leakage light by providing a reflection plate or a light absorbing film at a boundary between the pixels in order to avoid color mixing to an adjacent pixel.

The solid-state imaging element 40 includes the B diffraction grating 42 and the G diffraction grating 44 each having scatterers arranged at an appropriate cycle and further includes the first PD 43 and the second PD 45 formed in thinned layers, making it possible to suppress structurally unavoidable color mixing for each of the pixels and to suppress sensitivity reduction in each of the color components. Moreover, since the photo sensitivity characteristic of each of the pixels of the solid-state imaging element 40 is brought closer to an ideal spectrum, the matrix coefficient of color correction calculation at a subsequent stage of the solid-state imaging element 40 is suppressed to be a low level, making it possible to achieve an image with high image quality and suppressed deterioration of the SN ratio.

Figure 17:
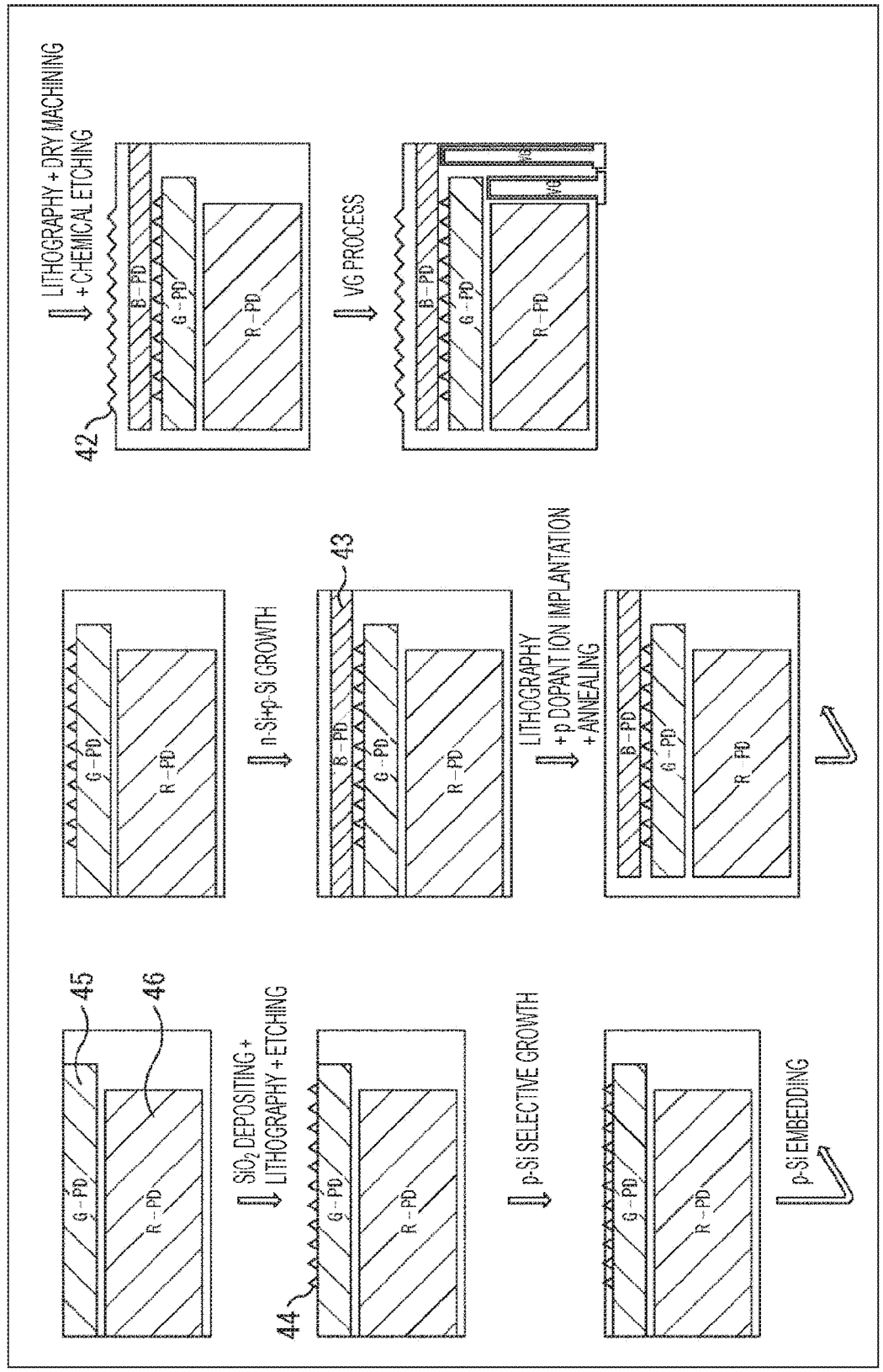
FIG. 17 is a diagram illustrating a manufacturing process of the third configuration example of the solid-state imaging element illustrated in FIG. 16.

Next, a manufacturing process of the solid-state imaging element 40 will be described. FIG. 17 illustrates the manufacturing process of the solid-state imaging element 40.

The third PD 46 and the second PD 45 are formed in an Si substrate. Specifically, the third PD 46 and the second PD 45 are formed by doping toward the Si substrate an n-type (or p-type) impurity by ion implantation and activating the impurity by annealing treatment, or by doping the n type (or p type) impurity during Si epitaxial growth. As the n-type impurity, P, As, Sb, Bi or the like can be adopted. As the p-type impurity, B, In, or the like can be adopted.

Next, the G diffraction grating 44 is formed on an outermost surface of the second PD 45. Specifically, a resist film is formed on a film of an inorganic material (oxide, nitride, or the like) having a refractive index lower than that of Si at equal intervals by a lithography technique, and thereafter, the G diffraction grating 44 is cyclically diffracted by dry etching processing. Note that it is allowable to remove a damaged layer on the surface by chemical etching and to form it into a tapered shape.

Next, after embedding the G diffraction grating 44 by selectively growing p-Si (or n-Si), the first PD 43 is formed in the similar manner as the case of the second PD 45, or the like. Next, the B diffraction grating 42 is formed above the first PD 43. Specifically, resist films are applied at equal intervals by lithography, and thereafter irregularities to be the B diffraction grating 42 is formed by dry etching processing. Finally, a penetrating electrode is formed.

Note that, while description of the manufacturing process is omitted for the solid-state imaging elements 20 and 30, it is possible to manufacture these by a method similar to the manufacturing process of the above-described solid-state imaging element 40.

Modification Example

In the above-described first to third configuration examples of the solid-state imaging element, light having a predetermined wavelength among the incident light is diffracted by the diffraction grating.

In a modification example described below, the light of a predetermined wavelength among the incident light is laterally bent by surface plasmon resonance (SPR) generated by arranging a metal nanoparticle or a nanowire instead of the diffraction grating.

Figure 18:
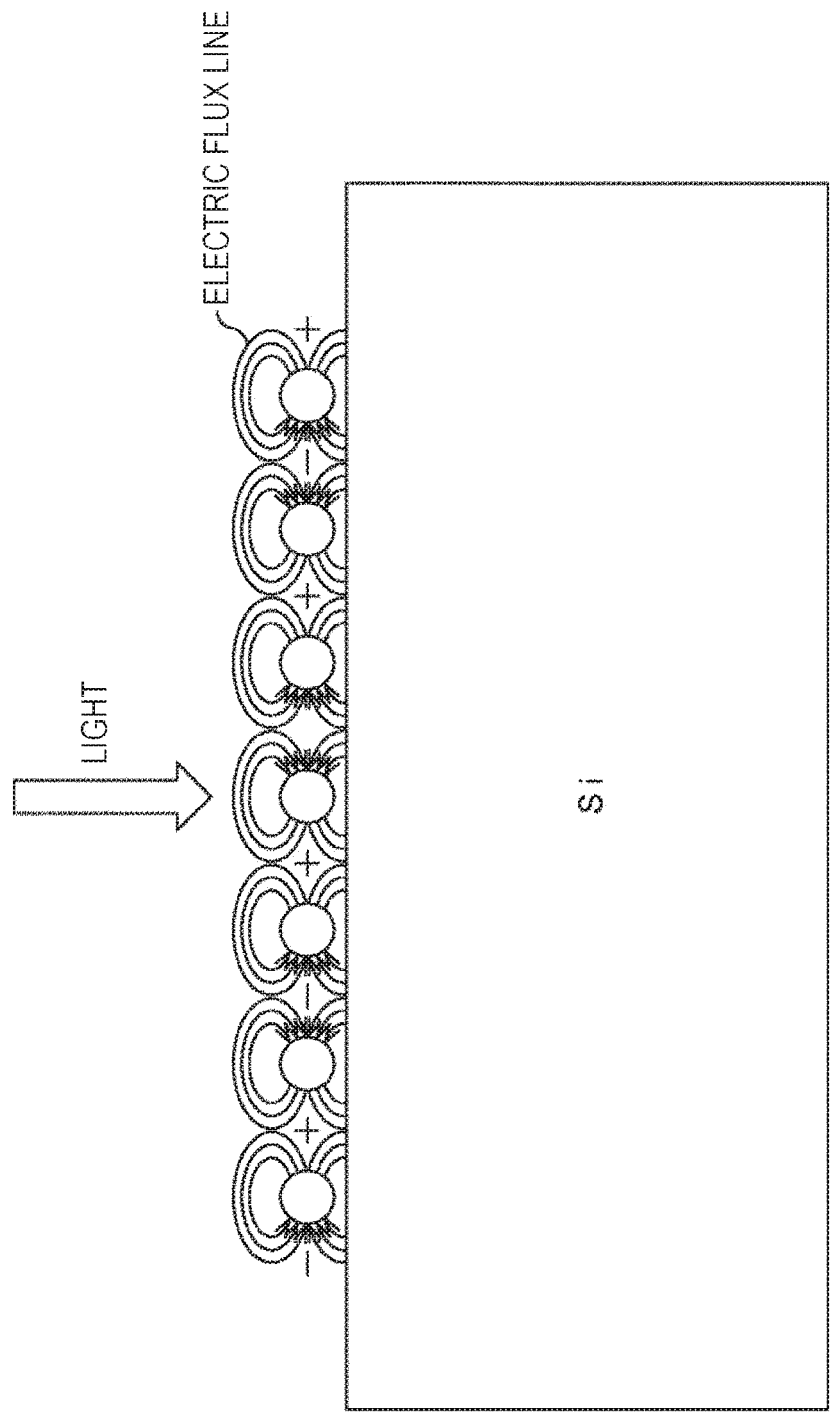
FIG. 18 is a diagram for explaining the principle of surface plasmon resonance.

Here, surface plasmon resonance will be described. FIG. 18 illustrates a principle of surface plasmon resonance.

As illustrated in the figure, surface plasmon resonance is generated in a case where the metal nanoparticle (or metal nanowire) is arranged on a Si surface. On the metal nanoparticle, an optical electric field and plasmon are coupled to each other to generate light absorption, leading to generation of an electric field that is significantly enhanced locally. At this time, light energy is converted into surface plasmon, which propagates on a metal surface or between the metal surfaces, allowing the light to travel laterally. Furthermore, this electric field enables absorption from the Si surface as near-field light. For example, gold can be a metal material that resonates with the light of the B component, and silver can be a material that resonates with light of the G component.

Figure 19:
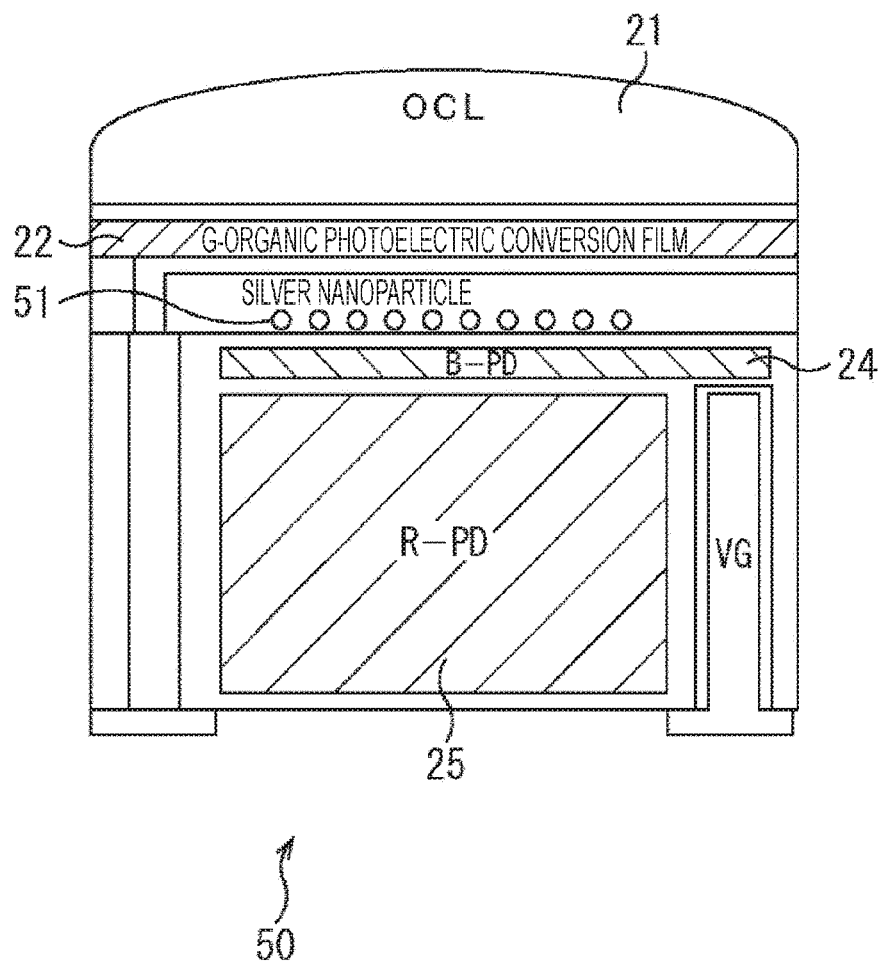
FIG. 19 is a cross-sectional view illustrating a fourth configuration example of a solid-state imaging element according to an embodiment of the present disclosure.

Fourth Configuration Example of Solid-State Imaging Element According to Embodiment of Present Disclosure FIG. 19 illustrates a fourth configuration example of the solid-state imaging element according to an embodiment of the present disclosure. A solid-state imaging element 50 is a modification example of the solid-state imaging element 20 illustrated in FIG. 14. In this modification example, the diffraction grating 23 in the solid-state imaging element 20 is replaced with a silver nanoparticle (may be silver nanowire) 51 having a diameter of 100 nm or less. The other constituents are denoted by the same reference numerals as the constituents of the solid-state imaging element 20, and the description thereof will be omitted.

The silver nanoparticle 51 may be formed, for example, by first allowing the silver nanoparticle to be colloidally dispersed previously in an organic liquid, and then, applying the silver nanoparticle to the outermost surface of the first PD 24 by spin coating, or attaching the silver nanoparticle by vacuum deposition. Note that there is no need to arrange the silver nanoparticle 51 on the Si surface but it is allowable to arrange this in the vicinity of the Si surface in order to reduce a dark current. In this case, arrangement may be in a range that enables the near-field light to reach Si, for example, at a distance of 300 nm or less from the Si surface.

On the solid-state imaging element 50, the surface plasmon is generated in accordance with the light of the B component by the silver nanoparticle 51, the B component propagates laterally, and the other components travel straight. Therefore, it is possible to obtain the action and effect similar to the case of the solid-state imaging element 20.

Figure 20:
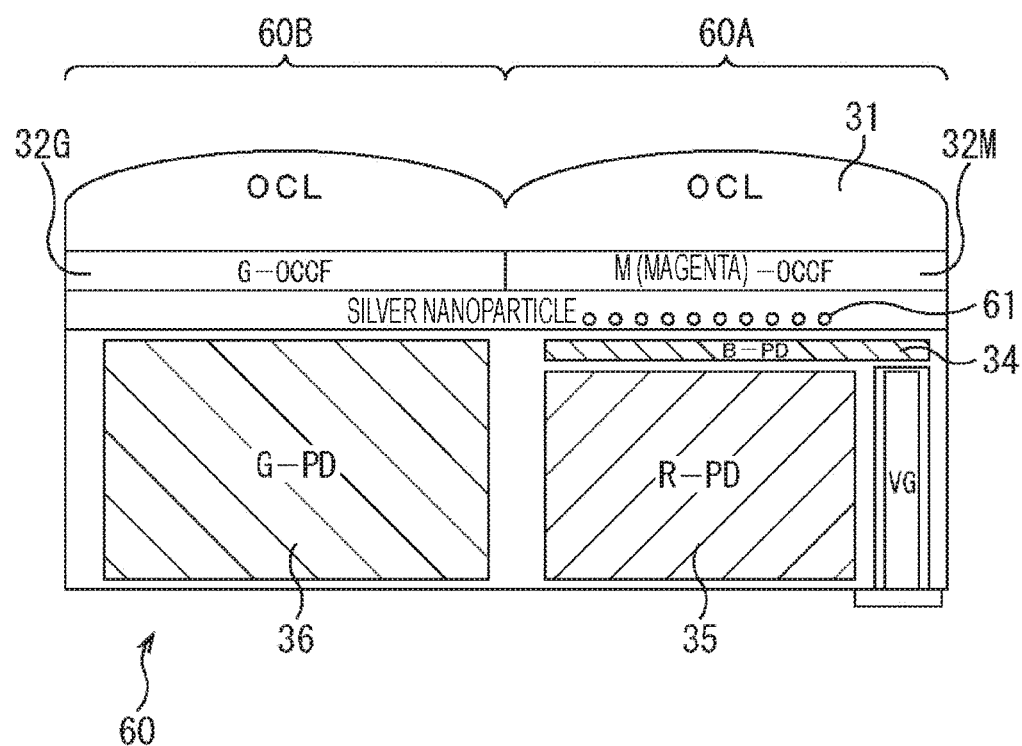
FIG. 20 is a cross-sectional view illustrating a fifth configuration example of a solid-state imaging element according to an embodiment of the present disclosure.

Fifth Configuration Example of Solid-State Imaging Element According to Embodiment of Present Disclosure FIG. 20 illustrates a fifth configuration example of the solid-state imaging element according to an embodiment of the present disclosure. A solid-state imaging element 60 is a modification example of the solid-state imaging element 30 illustrated in FIGS. 15A and 15B. In this modification example, the diffraction grating 33 in the first pixel 30A of the solid-state imaging element 30 is replaced with a silver nanoparticle (may be silver nanowire) 61 having a diameter of 100 nm or less. The other constituents are denoted by the same reference numerals as the constituents of the solid-state imaging element 30, and the description thereof will be omitted.

The formation of the silver nanoparticle 61 is similar to the formation of the silver nanoparticle 51 in the solid-state imaging element 50, and thus, the description thereof will be omitted.

On the solid-state imaging element 60, the surface plasmon is generated in accordance with the light of the B component by the silver nanoparticle 61, the B component propagates laterally, and the other components travel straight. Therefore, it is possible to obtain the action and effect similar to the case of the solid-state imaging element 50.

Application Example of Solid-State Imaging Element

Figure 21:
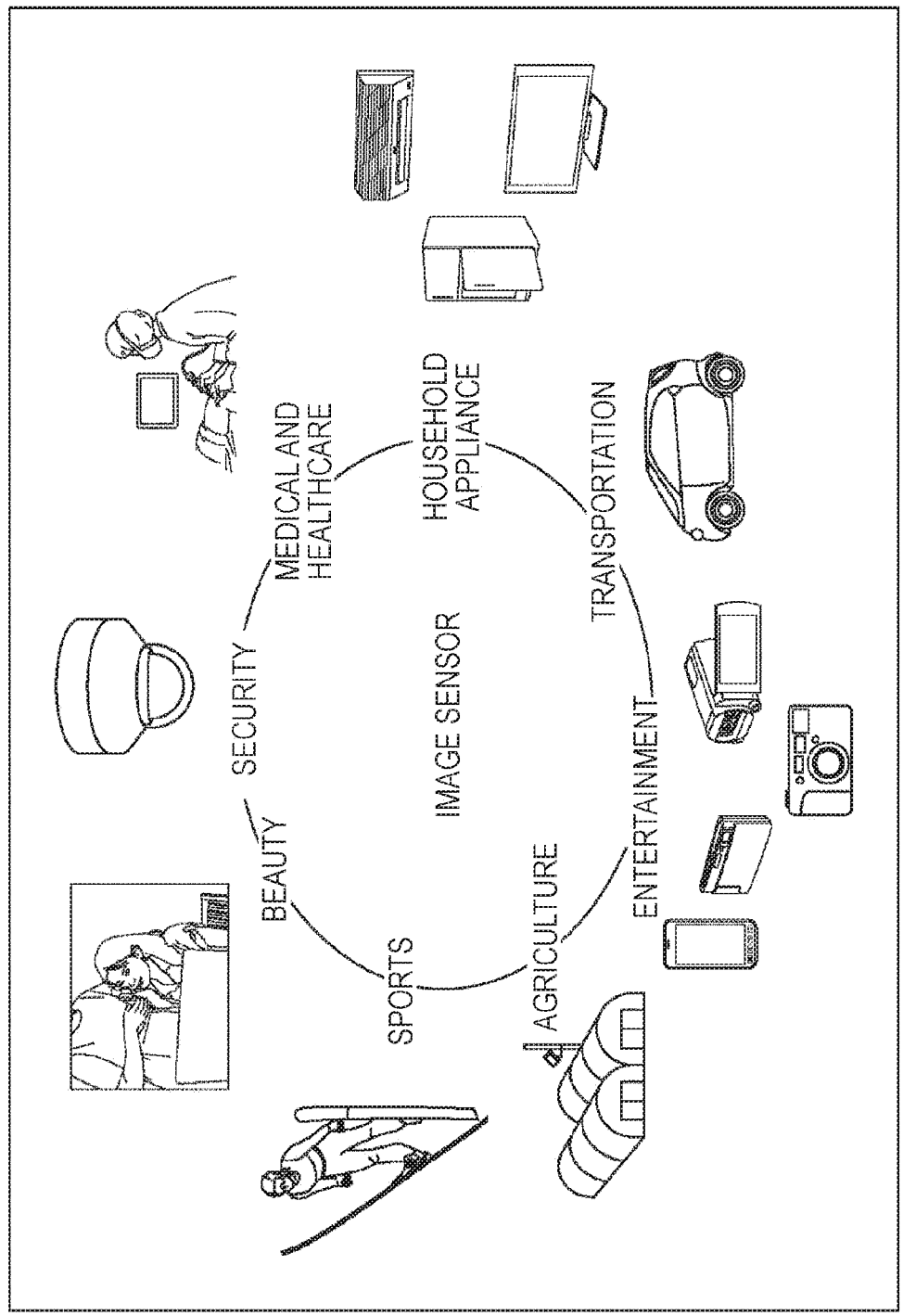
FIG. 21 is a diagram illustrating an application example of a solid-state imaging element.

FIG. 21 is a diagram illustrating an application example in which the above-described solid-state imaging element is used.

The above-described solid-state imaging element is applicable to various situations in which sensing is performed for light including visual light, infrared light, ultraviolet light, and X-ray. Examples of such situations are described as follows.

- A device for capturing an image for entertainment, such as a digital camera and a mobile phone with a camera function.
- A device for transportation, such as an on-vehicle sensor that photographs a front, back, surroundings, interior, or the like, of a vehicle in order to ensure safe driving including automatic stop, and to recognize driver's conditions, a monitor camera to monitor driving vehicles and roads, and a range-finding sensor to perform measurement of a distance between vehicles, or the like.
- A device for household appliances including a TV, a refrigerator, and an air conditioner, to photograph user's gesture and perform operation of the apparatus according to the gesture.
- A device for medical and health care fields, such as an endoscope, and a device for angiography using reception of infrared light.
- A device for security, such as a monitor camera for crime prevention, and a camera for personal authentication.
- A device for beauty, such as a skin measuring instrument to photograph the skin, and a microscope to photograph the scalp.

A device for sports, such as an action camera and a wearable camera for sports applications.

A device for agriculture, such as a camera to monitor conditions of fields and crops.

Note that embodiments of the present disclosure are not limited to the above-described embodiments but can be modified in a variety of ways within a scope of the present disclosure.

The present disclosure can also be configured as follows.

(1)

A solid-state imaging element including a vertical spectral structure pixel containing a plurality of photoelectric conversion units stacked in layers, in which the vertical spectral structure pixel includes:

a first photoelectric conversion unit configured to generate an electric charge in accordance with light having a first wavelength among incident light;

a second photoelectric conversion unit configured to generate an electric charge in accordance with light having a second wavelength among the incident light that has been transmitted through the first photoelectric conversion unit; and a first spectral unit formed on an upper surface of the first photoelectric conversion unit and configured to laterally bend a traveling direction of the light having the first wavelength of the incident light.

(2)

The solid-state imaging element according to (1), in which the first spectral unit bends the traveling direction of the light of the first wavelength of the incident light in an extending direction of the first photoelectric conversion unit.

(3)

The solid-state imaging element according to (1) or (2), in which the first spectral unit allows light other than the light having the first wavelength among the incident light to travel straight without changing the traveling direction of the light.

(4)

The solid-state imaging element according to any of (1) to (3), in which the first spectral unit is a diffraction grating.

(5)

The solid-state imaging element according to any of (1) to (3), in which the first spectral unit is a metal nanoparticle or a metal nanowire.

(6)

The solid-state imaging element according to any of (1) to (5), in which a layer thickness of the first photoelectric conversion unit is thinner compared with a thickness of operation of the second photoelectric conversion unit.

(7)

The solid-state imaging element according to any of (1) to (6), in which the vertical spectral structure pixel further includes a third photoelectric conversion unit configured to generate an electric charge in accordance with light having a third wavelength among the incident light, the first photoelectric conversion unit generates an electric charge in accordance with the light having the first wavelength that has been transmitted through the third photoelectric conversion unit and has a traveling direction bent by the first spectral unit, and the second photoelectric conversion unit generates an electric charge in accordance with the light having the second wavelength among the incident light that has been transmitted through the third photoelectric conversion unit, the first spectral unit, and the first photoelectric conversion unit.

(8)

The solid-state imaging element according to any of (1) to (7), in which the first and second photoelectric conversion units are PDs and the third photoelectric conversion unit is an organic photoelectric conversion film.

(9)

The solid-state imaging element according to any of (1) to (6), further including a non-vertical spectral structure pixel including a third photoelectric conversion unit configured to generate an electric charge according to the light of the third wavelength among the incident light.

(10)

The solid-state imaging element according to (9), in which the first to third photoelectric conversion units are PDs.

(11)

The solid-state imaging element according to (9) or (10), in which the non-vertical spectral structure pixel further includes a color filter configured to transmit solely the light of the third wavelength, on an upper surface of the third photoelectric conversion unit, and the vertical spectral structure pixel further includes a color filter configured to transmit solely the light having the first wavelength and the second wavelength, on an upper surface of the first spectral unit.

(12)

The solid-state imaging element according to any of (1) to (6), in which the vertical spectral structure pixel further includes:

a third photoelectric conversion unit configured to generate an electric charge in accordance with light having a third wavelength among incident light; and a second spectral unit formed on an upper surface of the third photoelectric conversion unit and configured to laterally bend a traveling direction of the light having the third wavelength of the incident light, the third photoelectric conversion unit generates an electric charge in accordance with the light having the third wavelength among the incident light that has been transmitted through the first spectral unit and the first photoelectric conversion unit, and the second photoelectric conversion unit generates an electric charge in accordance with the light having the second wavelength among the incident light that has been transmitted through the first spectral unit, the first photoelectric conversion unit, the second spectral unit, and the third photoelectric conversion unit.

(13)

The solid-state imaging element according to (12), in which the second spectral unit is one of a diffraction grating, a metal nanoparticle, and a metal nanowire.

(14)

The solid-state imaging element according to (12), in which the first to third photoelectric conversion units are PDs.

(15)

The solid-state imaging element according to any of (1) to (14), in which the vertical spectral structure pixel further includes a light condensing unit configured to condense the incident light to a position in the vicinity of a center of the vertical spectral structure pixel.

(16)

The solid-state imaging element according to any of (7) to (15), in which the light having the first wavelength is light of a B component, the light having the second wavelength is light of an R component, and the light having the third wavelength is light of a G component.

(17)

An electronic apparatus including a solid-state imaging element including a vertical spectral structure pixel containing a plurality of photoelectric conversion units stacked in layers, in which the vertical spectral structure pixel includes:

a first photoelectric conversion unit configured to generate an electric charge in accordance with light having a first wavelength among incident light;

a second photoelectric conversion unit configured to generate an electric charge in accordance with light having a second wavelength among the incident light that has been transmitted through the first photoelectric conversion unit; and a first spectral unit formed on an upper surface of the first photoelectric conversion unit and configured to laterally bend a traveling direction of the light having the first wavelength of the incident light.

REFERENCE SIGNS LIST 11 diffraction grating
12 first PD
13 second PD
20 solid-state imaging element
21 on-chip lens
22 organic photoelectric conversion film
23 diffraction grating
24 first PD
25 second PD
30 solid-state imaging element
30A first pixel
30B second pixel
31 on-chip lens
32 on-chip color filter
33 diffraction grating
34 first PD
35 second PD
36 third PD
40 solid-state imaging element
41 on-chip lens
42 B diffraction grating
43 second PD
44 G diffraction grating
45 second PD
46 third PD
50 solid-state imaging element
51 silver nanoparticle
60 solid-state imaging element
61 silver nanoparticle

The invention claimed is:

1. A solid-state imaging element, comprising a vertical spectral structure pixel containing a plurality of photoelectric conversion units stacked in layers, wherein the vertical spectral structure pixel includes:

a first photoelectric conversion unit configured to generate an electric charge in accordance with light having a first wavelength among incident light;

a second photoelectric conversion unit configured to generate an electric charge in accordance with light having a second wavelength among the incident light transmitted through the first photoelectric conversion unit; and a first spectral unit on an upper surface of the first photoelectric conversion unit, wherein the first spectral unit is configured to laterally bend a traveling direction of the light having the first wavelength of the incident light, wherein the first spectral unit is of a first metal nanowire.

2. The solid-state imaging element according to claim 1, wherein the first spectral unit bends the traveling direction of the light having the first wavelength of the incident light in an extending direction of the first photoelectric conversion unit.

3. The solid-state imaging element according to claim 2, wherein the first spectral unit allows light other than the light having the first wavelength among the incident light to travel straight without changing the traveling direction of the light.

4. The solid-state imaging element according to claim 2, wherein the first spectral unit is a diffraction grating.

5. The solid-state imaging element according to claim 2, wherein a layer thickness of the first photoelectric conversion unit is thinner compared with a thickness of operation of the second photoelectric conversion unit.

6. The solid-state imaging element according to claim 2, wherein the vertical spectral structure pixel further includes a third photoelectric conversion unit configured to generate an electric charge in accordance with light having a third wavelength among the incident light, the first photoelectric conversion unit generates an electric charge in accordance with the light having the first wavelength transmitted through the third photoelectric conversion unit and has a traveling direction bent by the first spectral unit, and the second photoelectric conversion unit generates an electric charge in accordance with the light having the second wavelength among the incident light transmitted through the third photoelectric conversion unit, the first spectral unit, and the first photoelectric conversion unit.

7. The solid-state imaging element according to claim 6, wherein the first photoelectric conversion unit and the second photoelectric conversion units are photodiodes, and the third photoelectric conversion unit is an organic photoelectric conversion film.

8. The solid-state imaging element according to claim 2, further comprising a non-vertical spectral structure pixel including a third photoelectric conversion unit configured to generate an electric charge in accordance with light having a third wavelength among the incident light.

9. The solid-state imaging element according to claim 8, wherein the first photoelectric conversion unit, the second photoelectric conversion unit, and the third photoelectric conversion unit are photodiodes.

10. The solid-state imaging element according to claim 8, wherein the non-vertical spectral structure pixel further includes a color filter configured to transmit solely the light having the third wavelength, on an upper surface of the third photoelectric conversion unit, and the vertical spectral structure pixel further includes a color filter configured to transmit solely the light having the first wavelength and the light having the second wavelength, on an upper surface of the first spectral unit.

11. The solid-state imaging element according to claim 2, wherein:
the vertical spectral structure pixel further includes:
a third photoelectric conversion unit configured to generate an electric charge in accordance with light having a third wavelength among incident light; and
a second spectral unit on an upper surface of the third photoelectric conversion unit, wherein the second spectral unit is configured to laterally bend a traveling direction of the light having the third wavelength of the incident light,
the third photoelectric conversion unit generates an electric charge in accordance with the light having the third wavelength among the incident light transmitted through the first spectral unit and the first photoelectric conversion unit, and
the second photoelectric conversion unit generates an electric charge in accordance with the light having the second wavelength among the incident light transmitted through the first spectral unit, the first photoelectric conversion unit, the second spectral unit, and the third photoelectric conversion unit.

12. The solid-state imaging element according to claim 11,
wherein the second spectral unit is one of a diffraction grating, a metal nanoparticle, or a second metal nanowire.

13. The solid-state imaging element according to claim 11,
wherein the first photoelectric conversion unit, the second photoelectric conversion unit, and the third photoelectric conversion unit are photodiodes.

14. The solid-state imaging element according to claim 2,
wherein the vertical spectral structure pixel further includes a light condensing unit configured to condense the incident light to a position in vicinity of a center of the vertical spectral structure pixel.

15. The solid-state imaging element according to claim 6,
wherein the light having the first wavelength is light of a B component, the light having the second wavelength is light of an R component, and the light having the third wavelength is light of a G component.

16. An electronic apparatus, comprising a solid-state imaging element including a vertical spectral structure pixel containing a plurality of photoelectric conversion units stacked in layers,
wherein the vertical spectral structure pixel includes:
a first photoelectric conversion unit configured to generate an electric charge in accordance with light having a first wavelength among incident light;
a second photoelectric conversion unit configured to generate an electric charge in accordance with light having a second wavelength among the incident light transmitted through the first photoelectric conversion unit; and
a spectral unit on an upper surface of the first photoelectric conversion unit, wherein the spectral unit is configured to laterally bend a traveling direction of the light having the first wavelength of the incident light, and wherein the spectral unit is of a metal nanowire.

* * * * *